(12) United States Patent
Doddi et al.

(10) Patent No.: US 11,206,748 B2
(45) Date of Patent: Dec. 21, 2021

(54) FLEXIBLE HINGE TO ACCOMMODATE A FLEXIBLE HEAT SPREADER

(71) Applicant: Intel Corporation, Santa Clara, CA (US)

(72) Inventors: Raghavendra Doddi, Bangalore (IN); Ravishankar Srikanth, Chennai (IN); Kathiravan D, Bangalore (IN); Prakash Kurma Raju, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/713,430

(22) Filed: Dec. 13, 2019

(65) Prior Publication Data

US 2020/0120832 A1    Apr. 16, 2020

(51) Int. Cl.
*H05K 7/20* (2006.01)

(52) U.S. Cl.
CPC ..... *H05K 7/20454* (2013.01); *H05K 7/20472* (2013.01); *H05K 7/2049* (2013.01)

(58) Field of Classification Search
CPC .......... H05K 7/20454; H05K 7/20472; H05K 7/2049
USPC ...................................................... 361/704
See application file for complete search history.

(56) References Cited

U.S. PATENT DOCUMENTS

| | | | | |
|---|---|---|---|---|
| 5,588,483 A | * | 12/1996 | Ishida | F28D 15/02 165/104.33 |
| 5,621,613 A | * | 4/1997 | Haley | G06F 1/203 165/104.33 |
| 5,646,822 A | * | 7/1997 | Bhatia | F28D 15/02 165/104.33 |
| 5,781,409 A | * | 7/1998 | Mecredy, III | F28D 15/02 16/223 |
| 5,796,581 A | * | 8/1998 | Mok | G06F 1/203 165/104.33 |
| 5,822,187 A | * | 10/1998 | Garner | F28D 15/02 361/679.27 |
| 5,832,987 A | * | 11/1998 | Lowry | F28F 13/00 165/86 |
| 5,847,925 A | * | 12/1998 | Progl | G06F 1/203 361/679.47 |
| 5,910,883 A | * | 6/1999 | Cipolla | F28D 15/0233 165/104.33 |
| 5,975,195 A | * | 11/1999 | Lowry | G06F 1/203 165/104.33 |

(Continued)

FOREIGN PATENT DOCUMENTS

| | | | | |
|---|---|---|---|---|
| CN | 1505463 A | * | 6/2004 | ............. H01R 12/52 |
| WO | WO-2016179304 A1 | * | 11/2016 | ........... G06F 1/1656 |

OTHER PUBLICATIONS

EPO Dec. 11, 2021—Extended European Search Report from European application No. 20194490.7 11 pages.

*Primary Examiner* — Anatoly Vortman
(74) *Attorney, Agent, or Firm* — Patent Capital Group

(57) ABSTRACT

Particular embodiments described herein provide for an electronic device that can be configured to include a first housing, a second housing, a hinge that rotatably couples the first housing to the second housing, and a flexible heat spreader that extends from the second housing, through the hinge, and to the first housing. The hinge can accommodate deformations in the flexible heat spreader when the first housing is rotated relative to the second housing.

16 Claims, 18 Drawing Sheets

(56) References Cited

U.S. PATENT DOCUMENTS

| | | | | |
|---|---|---|---|---|
| 5,992,155 | A * | 11/1999 | Kobayashi | G06F 1/203 165/104.33 |
| 6,052,280 | A * | 4/2000 | Dilley | G06F 1/203 165/104.33 |
| 6,064,565 | A * | 5/2000 | Ishihara | G06F 1/1616 248/917 |
| 6,075,696 | A * | 6/2000 | Progl | G06F 1/203 16/226 |
| 6,097,597 | A * | 8/2000 | Kobayashi | F28D 15/0233 165/104.14 |
| 6,141,216 | A * | 10/2000 | Holung | F28D 15/0266 165/104.33 |
| 6,198,625 | B1 * | 3/2001 | Leman | G06F 1/1616 361/679.27 |
| 6,226,177 | B1 * | 5/2001 | Rude | G06F 1/1616 361/679.52 |
| 6,249,426 | B1 * | 6/2001 | O'Neal | G06F 1/1616 16/334 |
| 6,324,055 | B1 * | 11/2001 | Kawabe | G06F 1/1616 361/679.54 |
| 6,353,529 | B1 * | 3/2002 | Cies | G06F 1/1616 248/917 |
| 6,377,452 | B1 * | 4/2002 | Sasaki | G06F 1/203 165/104.33 |
| 6,512,670 | B1 * | 1/2003 | Boehme | G06F 1/1616 361/679.29 |
| 6,595,269 | B2 * | 7/2003 | Mitchell | F28D 15/0233 165/104.26 |
| 6,741,456 | B2 * | 5/2004 | Sellers | G06F 1/1616 16/338 |
| 7,050,293 | B2 * | 5/2006 | Arbisi | H04M 1/022 361/679.3 |
| 7,236,355 | B2 * | 6/2007 | Kim | B60J 3/0204 224/312 |
| 7,417,863 | B2 * | 8/2008 | Park | H05K 7/20445 165/80.2 |
| 7,548,414 | B2 * | 6/2009 | Hung | G06F 1/162 361/679.26 |
| 7,573,710 | B2 * | 8/2009 | Morino | G06F 1/1616 361/679.55 |
| 7,663,877 | B2 * | 2/2010 | Goto | G06F 1/203 361/679.48 |
| 7,969,739 | B2 * | 6/2011 | Tsunoda | G06F 1/1616 361/704 |
| 8,537,529 | B2 * | 9/2013 | Qiu | G06F 1/1681 361/679.02 |
| 8,675,363 | B2 * | 3/2014 | Crooijmans | G06F 1/203 361/704 |
| 9,490,860 | B2 * | 11/2016 | Wu | H04M 1/185 |
| 10,120,421 | B1 * | 11/2018 | Hong | E05D 11/0054 |
| 10,488,898 | B2 * | 11/2019 | Shah | H01L 23/34 |
| 2012/0020045 | A1 * | 1/2012 | Tanase | H01H 13/85 361/807 |
| 2013/0027886 | A1 * | 1/2013 | Crooijmans | G06F 1/203 361/704 |
| 2018/0092253 | A1 * | 3/2018 | Qiu | H05K 1/0204 |
| 2018/0284855 | A1 | 10/2018 | North et al. | |
| 2018/0284856 | A1 * | 10/2018 | Shah | G06F 1/1637 |
| 2019/0041922 | A1 * | 2/2019 | Kurma Raju | G06F 1/1616 |
| 2019/0317572 | A1 * | 10/2019 | North | G06F 1/1616 |
| 2019/0317576 | A1 * | 10/2019 | North | G06F 1/1681 |

* cited by examiner

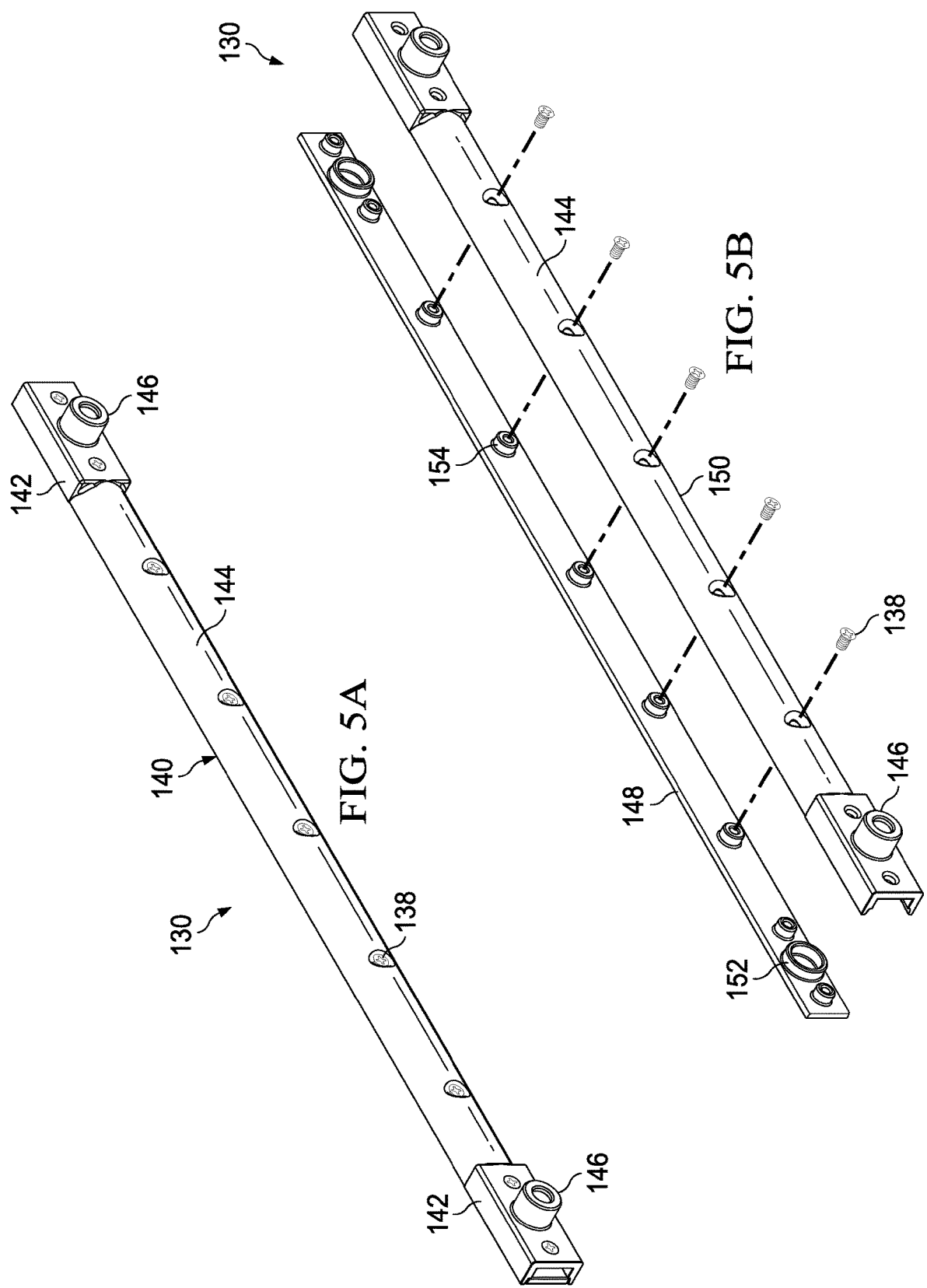

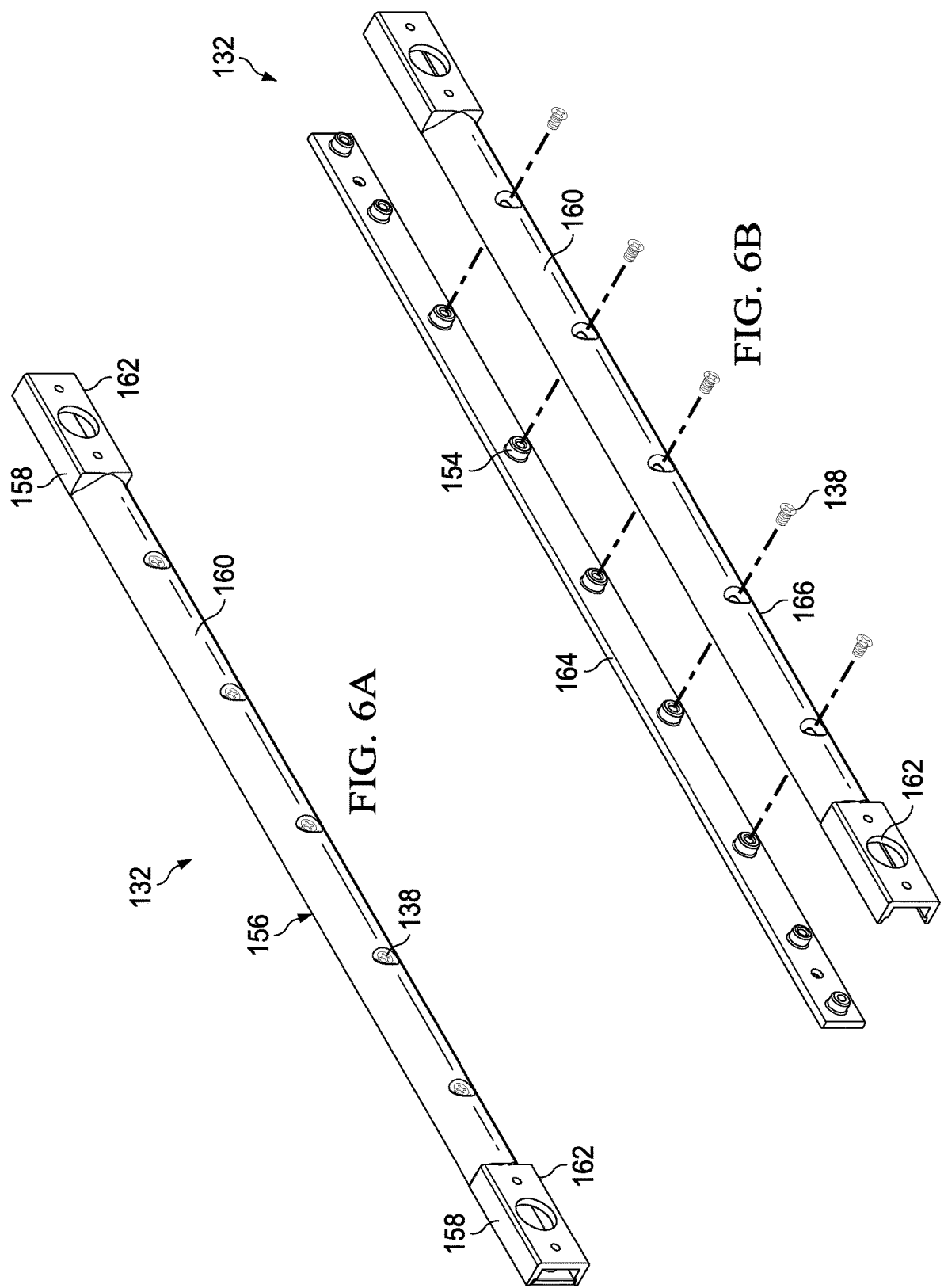

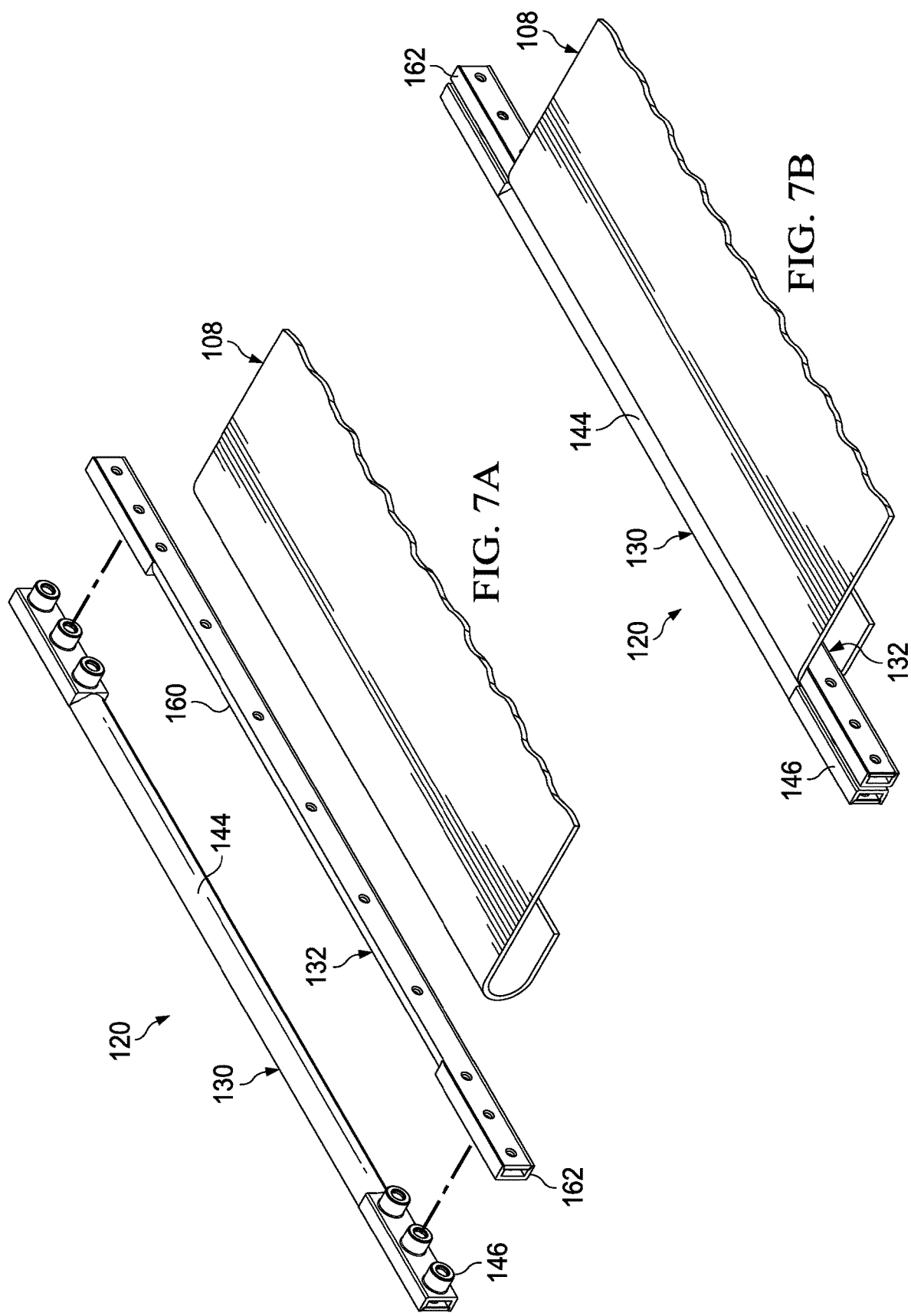

FLEXIBLE HINGE TO ACCOMMODATE A FLEXIBLE HEAT SPREADER

TECHNICAL FIELD

This disclosure relates in general to the field of computing, and more particularly, to a flexible hinge to accommodate a flexible heat spreader.

BACKGROUND

End users have more electronic device choices than ever before. A number of prominent technological trends are currently afoot (e.g., more computing devices, more devices that can change into different configurations, etc.), and these trends are changing the electronic device landscape. Some emerging trends place increasing performance demands on systems. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 5A is a simplified block diagram of a portion of an electronic device to enable a flexible hinge to accommodate a flexible heat spreader, in accordance with an embodiment of the present disclosure;

FIG. 5B is a simplified block diagram exploded view of a portion of an electronic device to enable a flexible hinge to accommodate a flexible heat spreader, in accordance with an embodiment of the present disclosure;

FIG. 6A is a simplified block diagram of a portion of an electronic device to enable a flexible hinge to accommodate a flexible heat spreader, in accordance with an embodiment of the present disclosure;

FIG. 6B is a simplified block diagram exploded view of a portion of an electronic device to enable a flexible hinge to accommodate a flexible heat spreader, in accordance with an embodiment of the present disclosure;

FIG. 7A is a simplified block diagram of a portion of an electronic device to enable a flexible hinge to accommodate a flexible heat spreader, in accordance with an embodiment of the present disclosure;

FIG. 7B is a simplified block diagram of a portion of an electronic device to enable a flexible hinge to accommodate a flexible heat spreader, in accordance with an embodiment of the present disclosure;

Figure 1A:
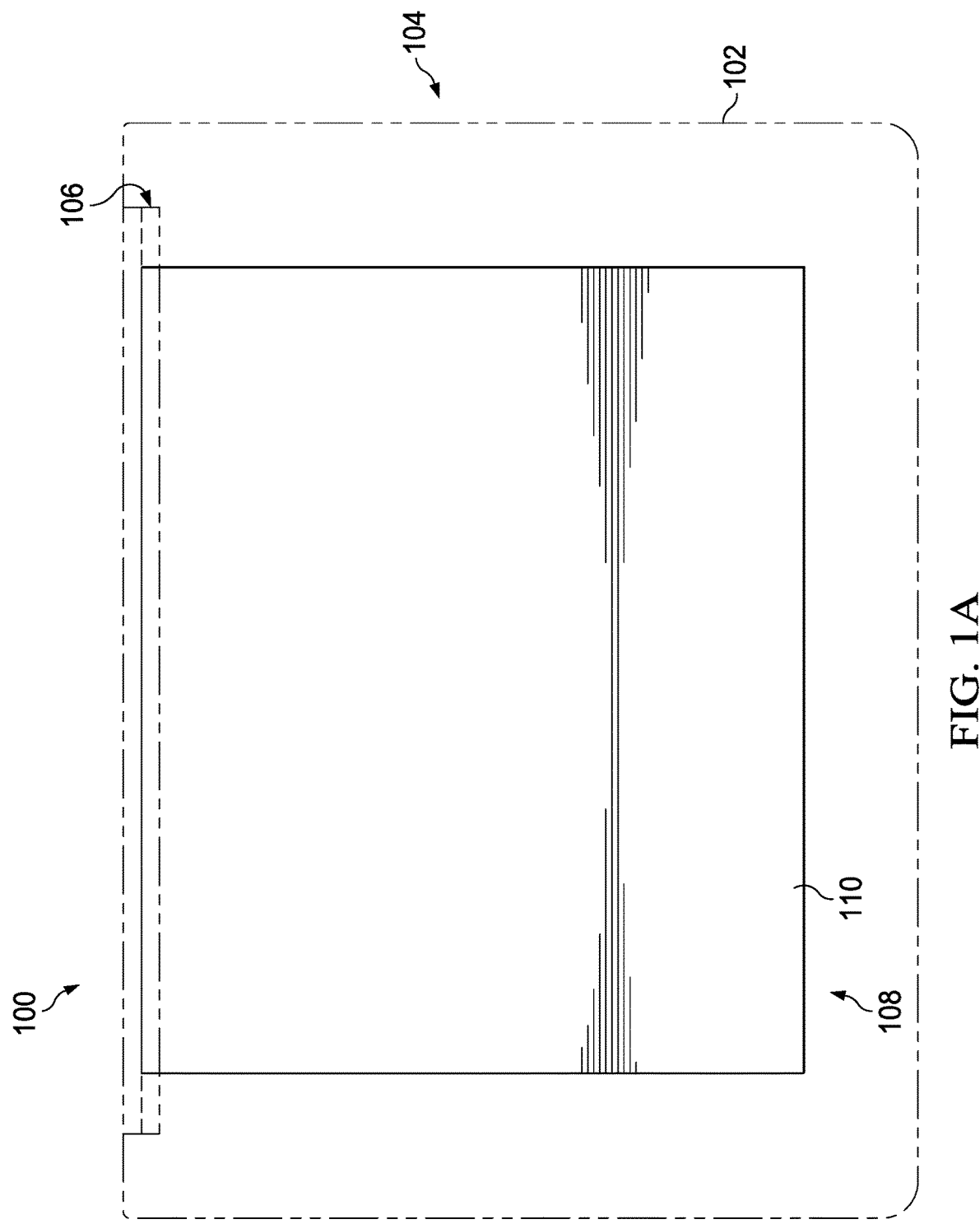
FIG. 1A is a simplified block diagram of an electronic device to enable a flexible hinge to accommodate a flexible heat spreader, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to a system for enabling a flexible hinge to accommodate a flexible heat spreader. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

FIG. 1A is a simplified block diagram of an electronic device 100 configured with a flexible hinge to accommodate a flexible heat spreader, in accordance with an embodiment of the present disclosure. In an example, electronic device 100 can include a first housing 102 and a second housing 104. First housing 102 can be rotatably coupled to second housing 104 using a hinge 106. A flexible heat spreader 108 can extend from second housing 104, through hinge 106, and to first housing 102. Flexible heat spreader 108 can include a first housing portion heat spreader 110 located in first housing 102. As illustrated in FIG. 1A, electronic device 100 is in a closed laptop configuration.

Figure 1B:
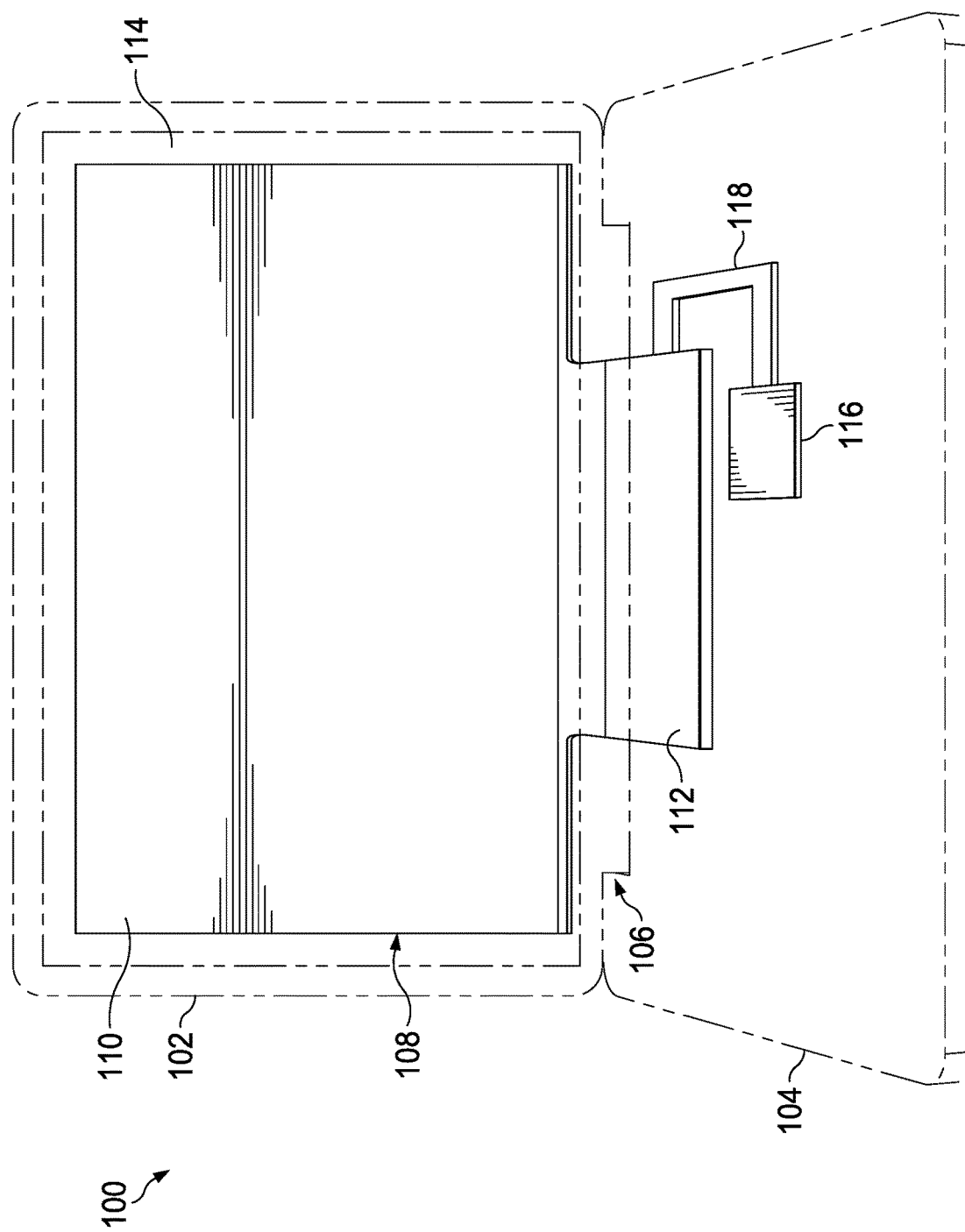
FIG. 1B is a simplified block diagram of an electronic device to enable a flexible hinge to accommodate a flexible heat spreader, in accordance with an embodiment of the present disclosure.

Turning to FIG. 1B, as illustrated in FIG. 1B, first housing 102 can be rotated about hinge 106 relative to second housing 104 such that electronic device 100 is in an open configuration. First housing 102 can include first housing portion heat spreader 110 and a display 114. Second housing 104 can include a second housing portion heat spreader 112, a heat source 116, and a heat pipe 118. Flexible heat spreader 108 can enable a heat transfer of at least a portion of heat from heat source 116 in second housing 104, across hinge 106, and to first housing portion heat spreader 110 in first housing 102. In some examples, flexible heat spreader 108 can be over heat source 116. In other examples, flexible heat spreader 108 can be over a heat pipe or some other rigid heat spreader and the heat pipe or other rigid heat spreader can be over heat source 116. The heat pipe or other rigid heat spreader can collect thermal energy from heat source 116 and transfer the collected thermal energy to flexible heat spreader 108. In an example implementation, flexible heat spreader 108 can be coupled to the chassis of first housing 102. Heat source 116 may be a processor, computer processing unit (CPU), graphics processing unit (GPU), battery, memory, or some other type of component or element in electronic device 100 that generates heat.

Figure 1C:
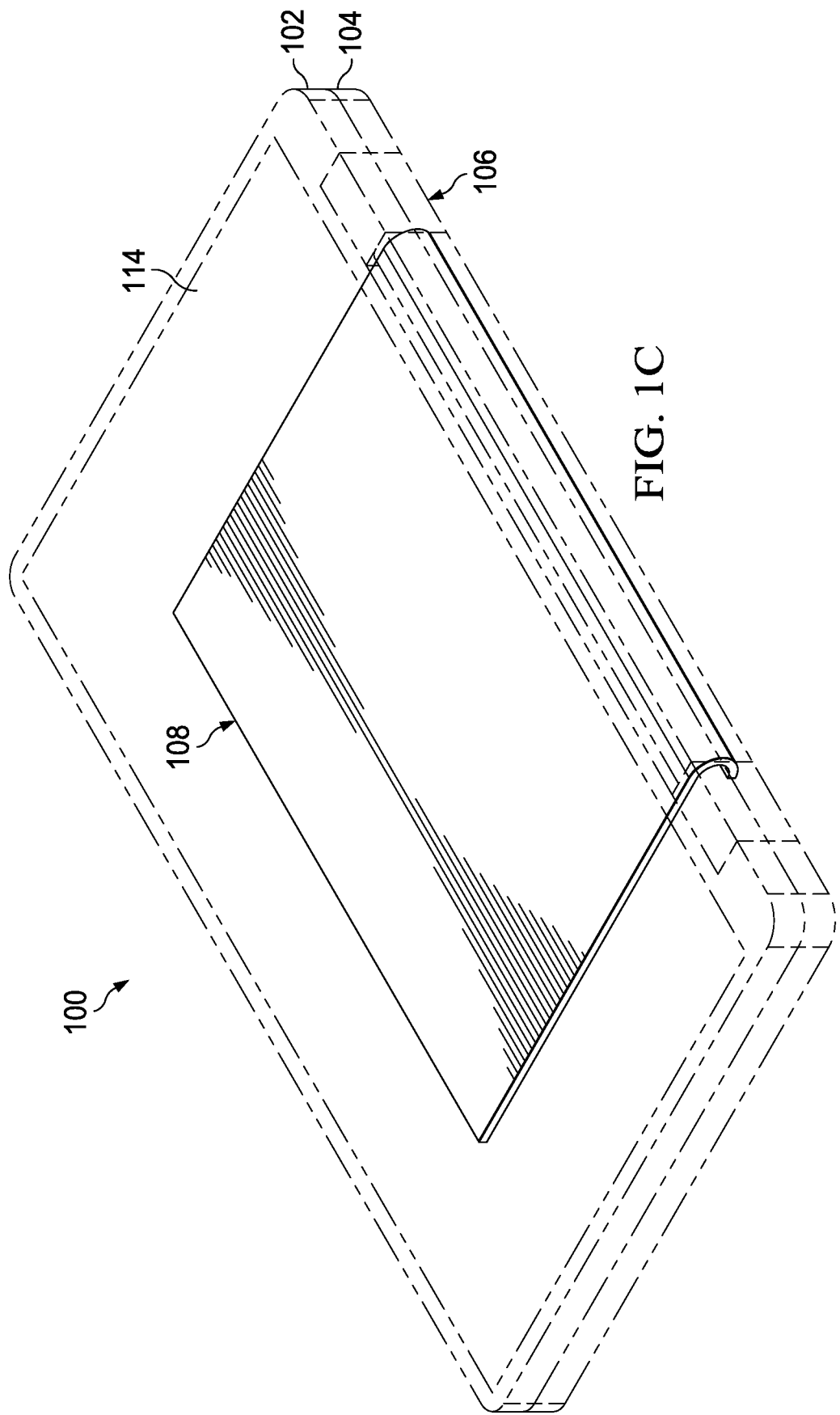
FIG. 1C is a simplified block diagram of an electronic device to enable a flexible hinge to accommodate a flexible heat spreader, in accordance with an embodiment of the present disclosure.

Turning to FIG. 1C, as illustrated in FIG. 1C, first housing 102 can be rotated about hinge 106 relative to second housing 104 such that electronic device 100 is in a tablet configuration. In an example, flexible heat spreader 108 can be configured to go through hinge 106 and transfer the heat from heat source 116 in second housing 104 to first housing portion heat spreader 110 in first housing 102 where there is more surface area and the increased surface area can provide better cooling and dissipation of the thermal energy from heat source 116. More specifically, transferring the heat from heat source 116 in second housing 104 to first housing portion heat spreader 110 in first housing 102 allows for more area to transfer heat to the environment and away from electronic device 100. In an example, flexible heat spreader 108 can extend the length of chassis and up to the hinge locations in width based on available chassis dimensions. In a specific illustrative example, flexible heat spreader 108 can be about three hundred millimeters (300) by about two hundred (200) millimeters, or some other dimensions based on design constrains and/or other factors.

When first housing 102 is rotated on hinge 106 relative to second housing 104, flexible heat spreader 108 is bent in the hinge area. As flexible heat spreader 108 is bent, it experiences a distortion such that material nearer the outside convex surface of the bend is forced to stretch and comes into tension, while material nearer the inside concave surface of the bend comes into compression. In the cross section of flexible heat spreader 108, there is a plane called a neutral axis that separates the tension and compression zones. The neutral axis is an area within the bend where the material of flexible heat spreader 108 goes through no physical change during forming of the bend. On the outside of the neutral axis, the material of flexible heat spreader 108 is expanding while on the inside of the neutral axis the material of flexible heat spreader 108 is compressing. This causes the inside surface of flexible heat spreader 108, being inside of the bent neutral axis, to bend to a smaller radius than the outside of the bent neutral axis due to the bending arc length the inside surface of flexible heat spreader 108 being smaller than the bending arc length of the outside surface of flexible heat spreader 108. Therefore, the material on the outside of flexible heat spreader 108 will move further than the material on the inside of flexible heat spreader 108 and can become creased, folded, warped, or otherwise damaged. Electronic device 100 can be configured to accommodate the change in position of the material in flexible heat spreader 108 such that the material in flexible heat spreader 108 is not creased, folded, warped, or otherwise damaged as first housing 102 is rotated on hinge 106 relative to second housing 104.

In an example, hinge 106 can be configured to allow for about three-hundred and sixty degrees (360°) of rotation and can provide support for flexible heat spreader 108 as first housing 102 is rotated on hinge 106 relative to second housing 104. More specifically, hinge 106 can dynamically vary to absorb the slack created by the material in flexible heat spreader 108 when first housing 102 is rotated on hinge 106 relative to second housing 104. If hinge was not configured to accommodate the change in position of the material in flexible heat spreader 108 when first housing 102 is rotated on hinge 106 relative to second housing 104, then flexible heat spreader 108 could become creased, folded, warped, or otherwise damaged due to the stresses generated from the bend.

Flexible heat spreader 108 can be configured as a thermal cooling device to help remove thermal energy from one or more heat sources. First housing portion heat spreader 110 may be a passive cooling device. In an example, first housing portion heat spreader 110 can be coupled to or include an active cooling device to help to reduce the thermal energy or temperature of one or more heat sources. In addition, second housing 104 may include one or more passive cooling devices and/or active cooling devices to help remove thermal energy from one or more heat sources in second housing 104. The one or more passive cooling devices and/or active cooling devices in second housing 104 may be independent of flexible heat spreader 108 or may function in concert with flexible heat spreader 108.

In a specific example, flexible heat spreader 108 is coupled to a rigid or semi rigid heat spreader over a heat source (e.g., heat source 116). The term "rigid heat spreader" and "semi-rigid heat spreader" include a cold plate, heat pipe, vapor chamber, and other rigid or semi-rigid heat spreaders. The heat from the heat source is collected by the rigid or semi rigid heat spreader and transferred to flexible heat spreader 108. Flexible heat spreader 108 transfers the heat through hinge 106 and to first housing portion heat spreader 110 in first housing 102. Hinge 106 can include an adaptor which has a spring guided and actuated bar that enables cross spreading of flexible heat spreader 108 and allows flexible heat spreader 108 to dynamically vary the dimension of the material in flexible heat spreader 108 by absorbing the slack that is created when first housing 102 is rotated on hinge 106 relative to second housing 104. In some examples, flexible heat spreader 108 can be coupled to the chassis of electronic device 100.

It is to be understood that other embodiments may be utilized and structural changes may be made without departing from the scope of the present disclosure. Substantial flexibility is provided by electronic device 100 in that any suitable arrangements and configuration may be provided without departing from the teachings of the present disclosure.

For purposes of illustrating certain example techniques of electronic device 100, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

For example, in some devices, it can be difficult to cool one or more heat sources, especially when the heat sources are relatively close together and/or are located inside a relatively crowded housing that includes memory, processors, battery, etc. The relatively crowded housing can make it difficult to locate thermal solutions inside the crowded housing. In addition, typically the crowded housing acts as a base and is against a flat surface such as a table so it can be difficult to facilitate the movement of air inside the base and dissipate heat from a heat source. Further, in passively cooled systems, there is strong need to reduce the system thickness and at the same time increase the thermal performance. Designing thinner devices is constrained and limited by cooling capability and a cooling budget limitation that comes from the restriction of a thermal solution that can be designed in the base side alone without increasing the thickness of the system.

One solution is to transfer the heat from the crowded housing to a housing that is not crowded. For example, transferring heat from a base of a laptop to the lid provides more area to reject the heat to the environment. However, the base is typically coupled to the lid using a hinge and to transfer the heat from the base to the lid, the heat transfer device needs to go through the hinge.

Some current systems may use a rigid heat pipe as the pin of a system hinge where the system attempts to transfer the heat across the gap between the heat pipe pin and an inner surface of the hinge cylinder. However, with this system, a sliding surface between the heat pipe pin and outer portion of the hinge is required and there is typically a high thermal resistance across the sliding surface. Other current systems may use a flexible heat pipe where the lid is connected to the base by a flexible heat pipe that is perpendicular to the hinge axis. However, a flexible heat pipe requires a relatively large bend radius to avoid failure. Typically, the minimum bend radius for a flexible heat pipe is about or greater than twenty-five (25) millimeters (mm) and hinged devices often experience a full deflection of approximately one hundred and fifty (150) degrees, which results in tight bend radius for the heat pipe where strains are concentrated on the bending area of the heat pipe. The tight bend radius can cause reliability problems and will often fail under fatigue loading. Further, a flexible heat pipe is not suitable for thin clamshell solutions, because for thin clamshell systems, the bending radius should be less than ten (10) mm while the minimum bend radius for a flexible heat pipe is typically about or greater than twenty-five (25) mm. In addition, the large bend radius of the flexible heat pipe can make the system odd-shaped. What is needed is a hinge area that can allow for the transfer of heat from one housing to another housing across the hinge area.

A flexible hinge to accommodate a flexible heat spreader, as outlined in FIGS. 1A-1C, can help to resolve these issues (and others). For example, an electronic device (e.g., electronic device 100) can be configured to allow for a flexible hinge to accommodate a flexible heat spreader. More specifically, the electronic device can be configured to include a flexible heat spreader that can enable a heat transfer of at least a portion of heat from a heat source (e.g., computer processing unit (CPU), graphics processing unit (GPU), etc.) in a base (e.g., second housing 104) of a clamshell computer across a hinge (e.g., hinge 106) of the clamshell computer to a heat spreader (e.g., first housing portion heat spreader 110) in a lid (e.g., first housing 102) of the clamshell computer. The lid can be used for heat dissipation because it has a large surface area and it is often nearly vertical during use. Transferring heat with low resistance from the base to the lid, enables higher performance from the heat source and/or a quieter thinner system than current designs.

The electronic device can be configured to support the flexible heat spreader in a lay-flat mode and allow the flexible heat spreader to have an even bend from about zero degrees (0°) to about one hundred and eighty degrees (180°) of rotation or from about zero degrees (0°) to about three-hundred and sixty degrees (360°) of rotation without damaging the flexible heat spreader. The flexible heat spreader can include graphite, copper, aluminum, or some other flexible material that can be used as a heat spreader from the base to the lid of the electronic device and be configured to help increase the thermal performance of the electronic device while the system "Z" thickness is not significantly increased. The hinge can be configured to dynamically support the flexible heat spreader to accommodate the change in position of the material in flexible heat spreader 108 during rotation of the electronic device at various angles and up to three-hundred and sixty degrees (360°) such that the material in flexible heat spreader 108 is not creased, folded, warped, or otherwise damaged during the rotation.

In an example implementation, electronic device 100 is meant to encompass a computer, a personal digital assistant (PDA), a laptop or electronic notebook, a cellular telephone, an iPhone, an IP phone, or any other device, component, element, or object that includes a heat source and a first housing rotatably coupled to a second housing. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure associated with electronic device 100, electronic device 100 can include memory elements for storing information to be used in operations or functions. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received in electronic device 100 could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities.

Additionally, electronic device 100 may include one or more processors that can execute software or an algorithm to perform activities. A processor can execute any type of instructions associated with the data to achieve one or more operations. In one example, the processors could transform an element or an article (e.g., data) from one state or thing to another state or thing. In another example, the activities outlined herein may be implemented with fixed logic or programmable logic (e.g., software/computer instructions executed by a processor) and electronic device 100 could include some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements and modules described herein should be construed as being encompassed within the broad term 'processor.'

Figure 2A:
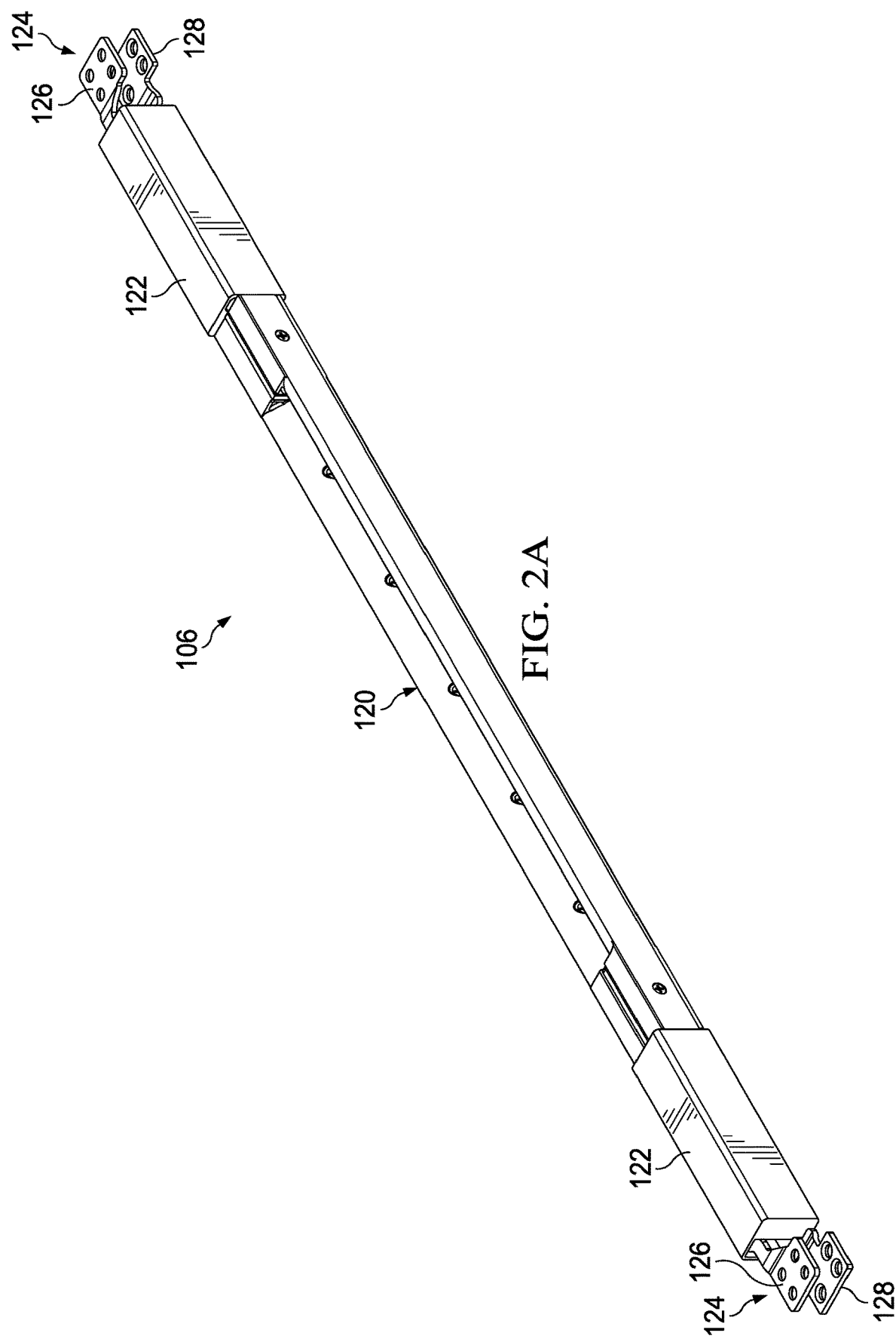
FIG. 2A is a simplified block diagram of a portion of an electronic device to enable a flexible hinge to accommodate a flexible heat spreader, in accordance with an embodiment of the present disclosure.

Turning to FIG. 2A, FIG. 2A is a simplified block diagram of hinge 106. In an example, hinge 106 can include a middle section 120, hinge caps 122, and torque engines 124. Hinge caps 122 can be located on both ends of middle section 120. Torques engines 124 can be located on an end of each of hinge caps 122. Each of torque engines 124 can include a first housing attachment 126 and a second housing attachment 128. Hinge caps 122 can be configured to couple torque engine 124 to moving roller 130 (illustrated in FIG. 2B) and fixed roller 132 (illustrated in FIG. 2B). First housing attachment 126 can allow hinge 106 to be coupled to first housing 102 (not shown) and second housing attachment 128 can allow hinge 106 to be coupled to second housing 104 (not shown).

Figure 2B:
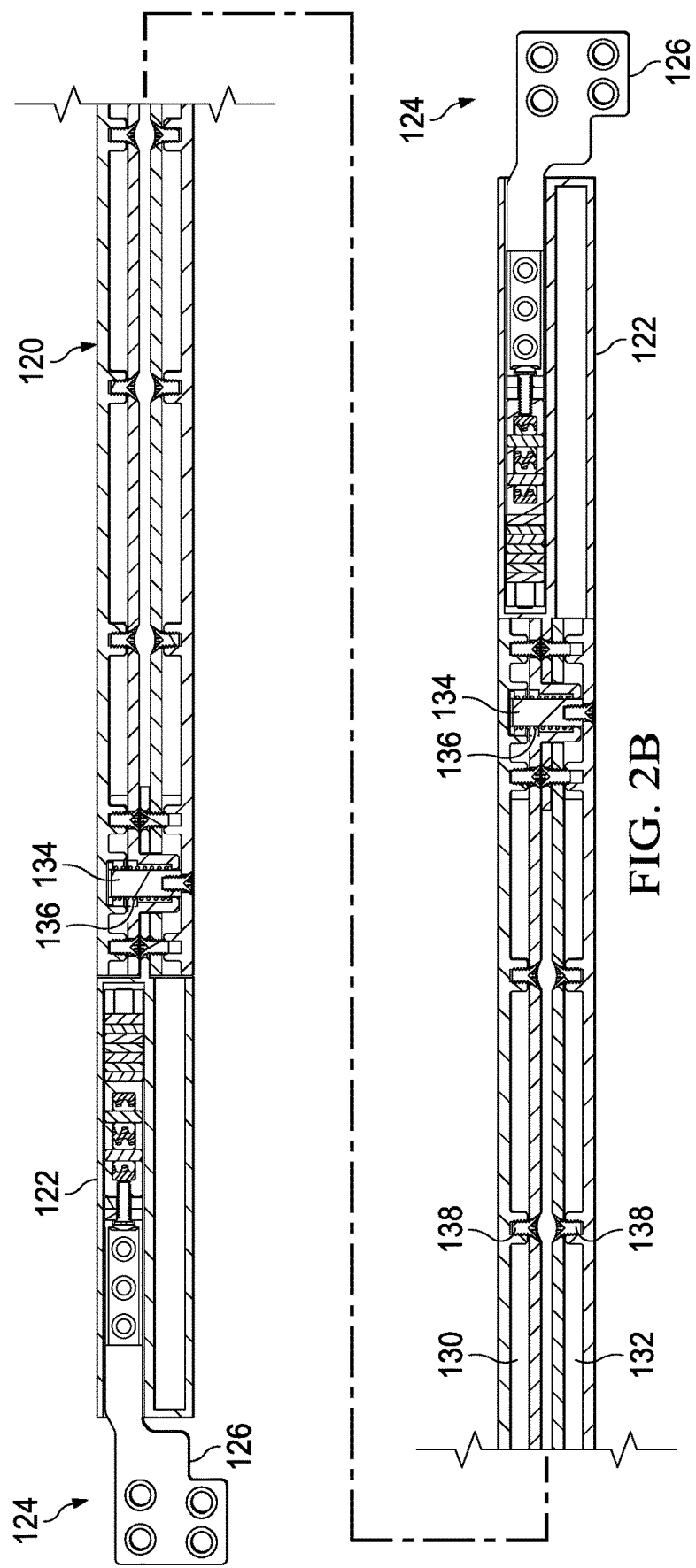
FIG. 2B is a simplified block diagram cutaway view of a portion of an electronic device to enable a flexible hinge to accommodate a flexible heat spreader, in accordance with an embodiment of the present disclosure.

Turning to FIG. 2B, FIG. 2B is a simplified block diagram cut away view of hinge 106. In an example, hinge 106 can include middle section 120, hinge caps 122, and torque engines 124. Middle section 120 can include a moving roller 130 and a fixed roller 132. Moving roller 130 and fixed roller 132 can be coupled together using an attachment means 134 and a spring 136. Each of moving roller 130 and fixed roller 132 can include securing means 138. Attachment means 134 and spring 136 can be configured to accommodate the change in position of the material in flexible heat spreader 108 when first housing 102 is rotated on hinge 106 relative to second housing 104 so flexible heat spreader 108 does not become creased, folded, warped, or otherwise damaged due to the stresses generated from the bending of flexible heat spreader 108 when first housing 102 is rotated on hinge 106 relative to second housing 104.

Figure 3:
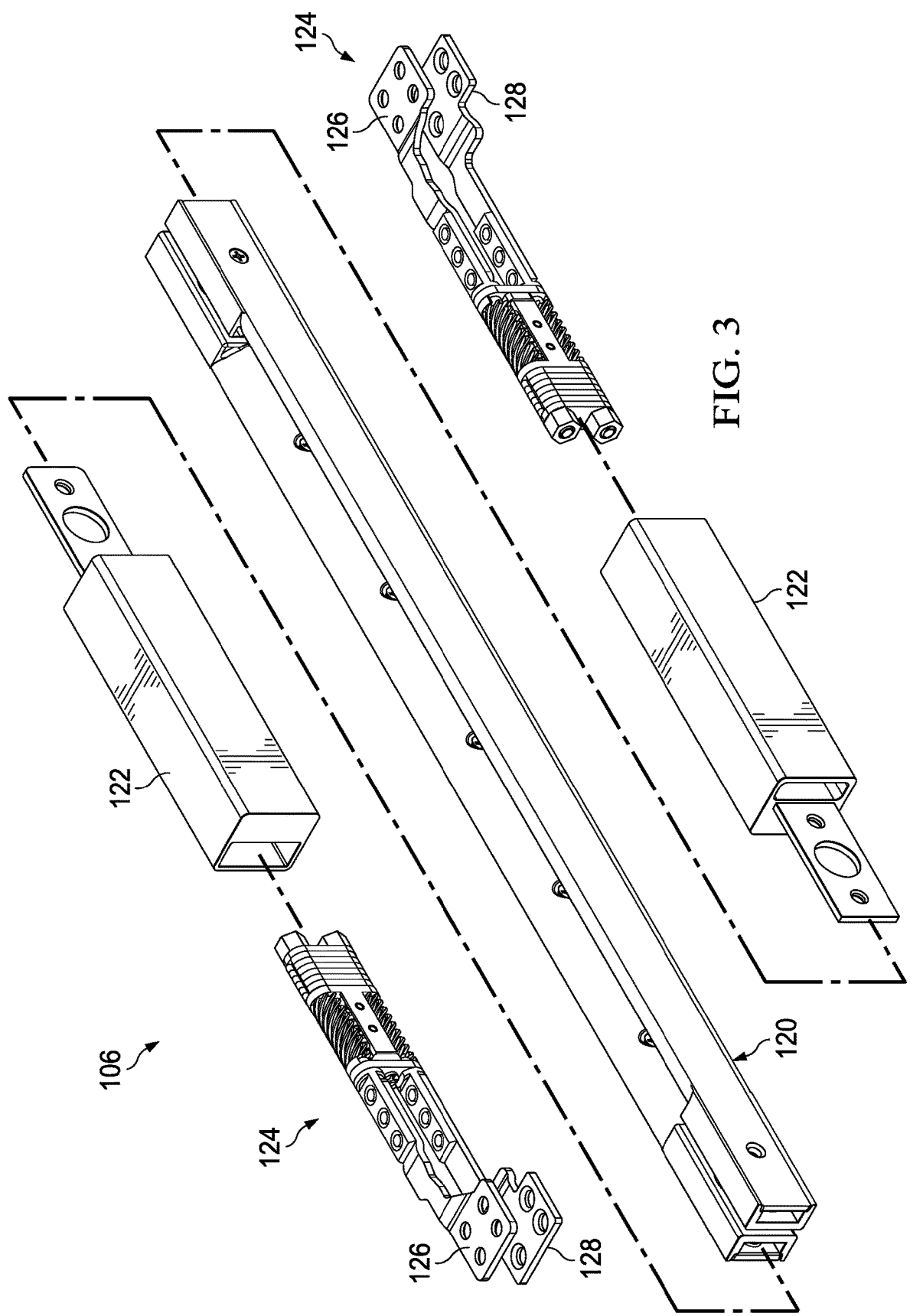
FIG. 3 is a simplified block diagram exploded view of a portion of an electronic device to enable a flexible hinge to accommodate a flexible heat spreader, in accordance with an embodiment of the present disclosure.

Turning to FIG. 3, FIG. 3 is a simplified block diagram of an exploded view of hinge 106. In an example, hinge 106 can include middle section 120, hinge caps 122, and torque engines 124. Hinge caps 122 can be located on both ends of middle section 120. Torque engines 124 can be located on an end of each of hinge caps 122. Each of torque engines 124 can include first housing attachment 126 and second housing attachment 128.

Figure 4:
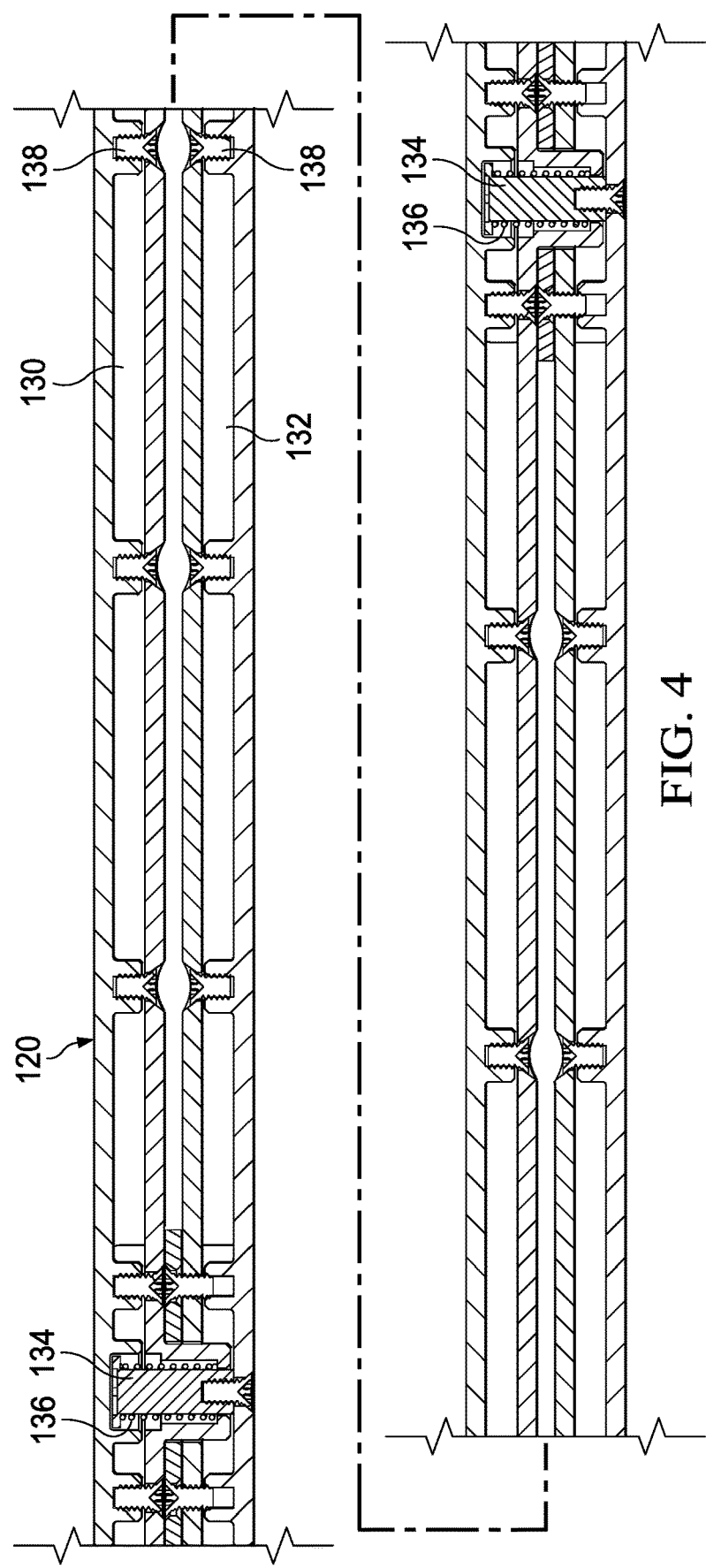
FIG. 4 is a simplified block diagram cutaway view of a portion of an electronic device to enable a flexible hinge to accommodate a flexible heat spreader, in accordance with an embodiment of the present disclosure.

Turning to FIG. 4, FIG. 4 is a simplified block diagram cut away view of middle section 120. Middle section 120 can include moving roller 130 and fixed roller 132. Moving roller 130 and fixed roller 132 can be coupled together using attachment means 134 and spring 136. Each of moving roller 130 and fixed roller 132 can include securing means 138.

Turning to FIG. 5A, FIG. 5A is a simplified block diagram of moving roller 130. Moving roller 130 can include a moving roller middle portion 140 and moving roller ends 142. Moving roller middle portion 140 can include securing means 138 and a moving roller curved profile 144. Each moving roller end 142 can include a slack roller cap 146. Slack roller cap 146 is configured to help guide attachment means 134 and spring 136 as attachment means 134 couples moving roller 130 to fixed roller 132.

Turning to FIG. 5B, FIG. 5B is a simplified block diagram exploded view of moving roller 130. Moving roller 130 can include a moving roller back plate 148 and a moving roller curved plate 150. Moving roller back plate 148 can include a slack roller cap seat 152 and securing means seats 154. Moving roller curved plate 150 can include moving roller curved profile 144 and slack roller cap 146. Slack roller cap seat 152 is configured to provide a seat, post, or fitting for slack roller cap 146 and help guide attachment means 134 and spring 136 through slack roller cap 146 as attachment means 134 couples moving roller 130 to fixed roller 132.

Turning to FIG. 6A, FIG. 6A is a simplified block diagram of fixed roller 132. Fixed roller 132 can include a fixed roller middle portion 156 and fixed roller ends 158. Fixed roller middle portion 156 can include a fixed roller curved profile 160. Each fixed roller end 158 can include a slack roller cap housing 162. Slack roller cap housing 162 is configured to provide a housing or fitting for slack roller cap 146 (illustrated in FIG. 5A) and help guide and/or position slack roller cap 146, attachment means 134, and spring 136 as attachment means 134 couples moving roller 130 to fixed roller 132. As moving roller 130 (illustrated in FIG. 5A) moves relative to fixed roller 132, slack roller cap 146 on moving roller 130 can move in slack roller cap housing 162 on fixed roller 132 and help keep moving roller 130 and fixed roller 132 in alignment relative to each other.

Turning to FIG. 6B, FIG. 6B is a simplified block diagram exploded view of fixed roller 132. Fixed roller 132 can include a fixed roller back plate 164 and a fixed roller curved plate 166. Fixed roller back plate 164 can include securing means seats 154. Fixed roller curved plate 166 can include fixed roller curved profile 160 and slack roller cap housing 162.

Turning to FIG. 7A, FIG. 7A is a simplified block diagram exploded view of a portion of hinge 106. Hinge 106 can include middle section 120. Middle section 120 can include moving roller 130 and fixed roller 132. Moving roller 130 can include moving roller curved profile 144 and slack roller cap 146. Fixed roller 132 can include fixed roller curved profile 160 and slack roller cap housing 162. In an example, flexible heat spreader 108 can be positioned between moving roller 130 and fixed roller 132.

Turning to FIG. 7B, FIG. 7B is a simplified block diagram of a portion of hinge 106. Hinge 106 can include middle section 120. Middle section 120 can include moving roller 130 and fixed roller 132. Moving roller 130 can include moving roller curved profile 144 and slack roller cap 146. Fixed roller 132 can include fixed roller curved profile 160 (not shown) and slack roller cap housing 162. In an example, flexible heat spreader 108 can be secured between moving roller 130 and fixed roller 132.

Figure 8A:
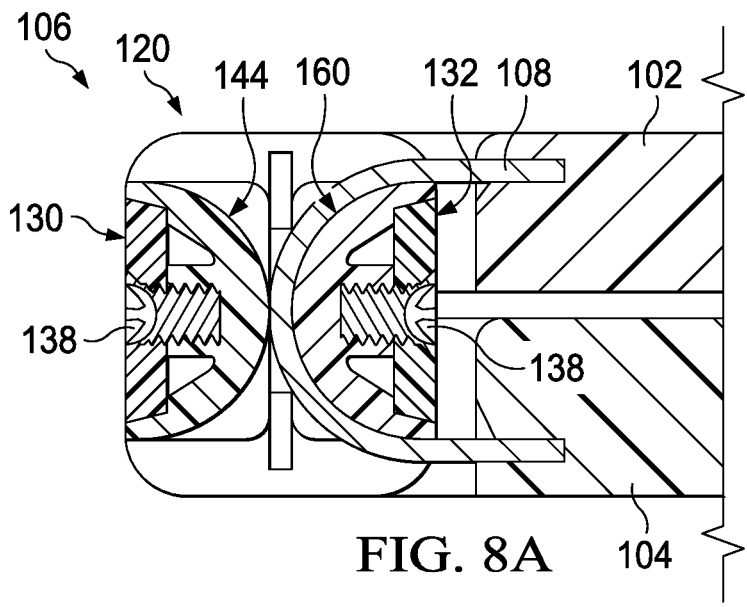
FIGS. 8A-8K are simplified block diagrams of a portion of an electronic device to enable a flexible hinge to accommodate a flexible heat spreader, in accordance with an embodiment of the present disclosure.

Turning to FIG. 8A, FIG. 8A is a simplified block diagram of a portion of hinge 106 when electronic device 100 is in a closed configuration. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, flexible heat spreader 108 can be between moving roller 130 and fixed roller 132 and follow the profile of fixed roller curved profile 160.

Figure 8B:
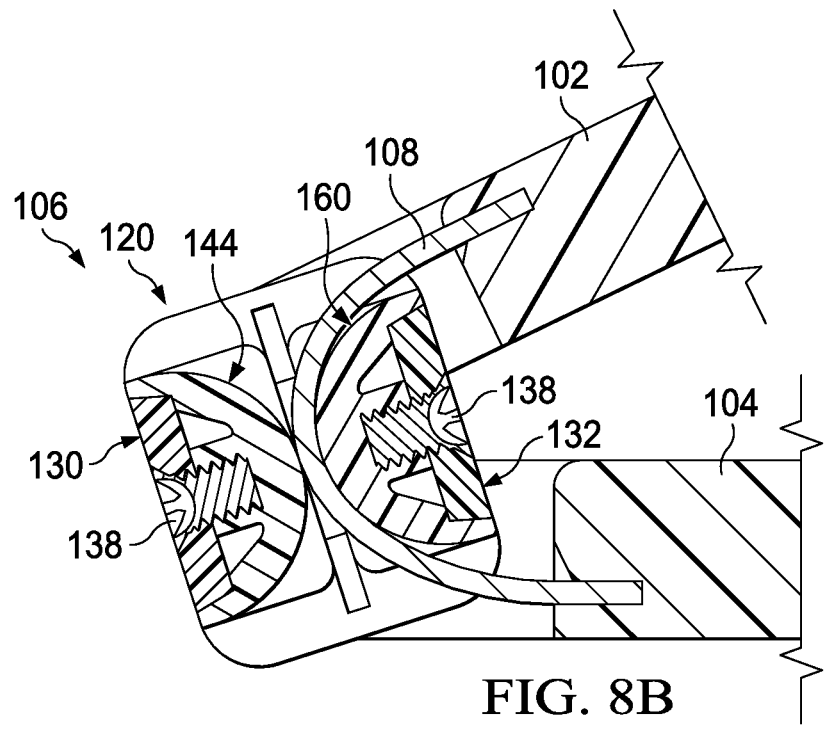

Turning to FIG. 8B, FIG. 8B is a simplified block diagram of a portion of hinge 106 when first housing 102 has been rotated (e.g., about thirty degrees (30°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8C:
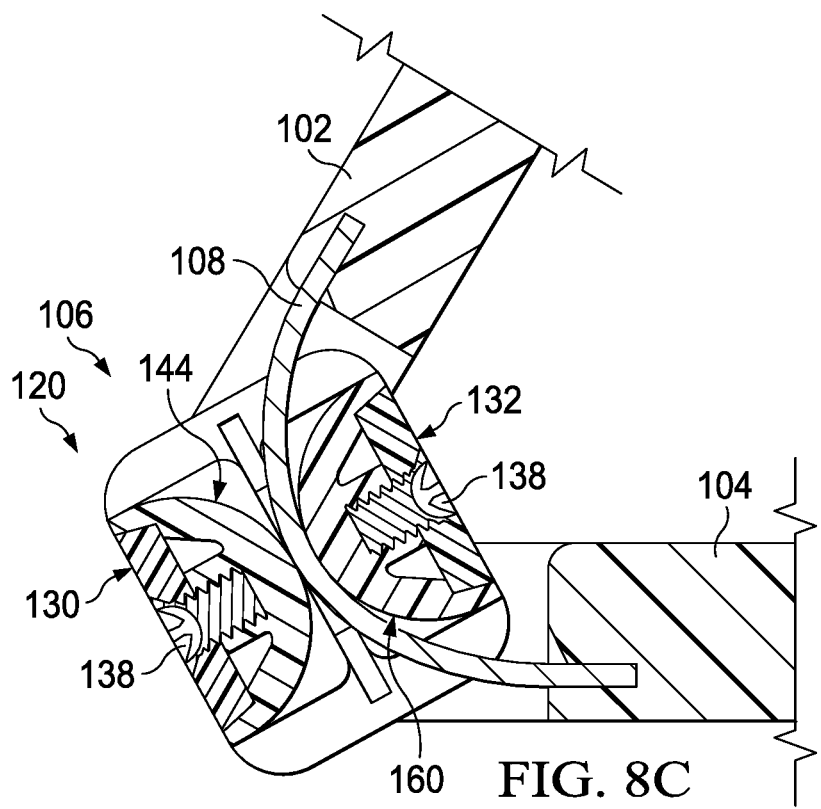

Turning to FIG. 8C, FIG. 8C is a simplified block diagram of a portion of hinge 106 when first housing 102 has been rotated (e.g., about sixty degrees (60°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8D:
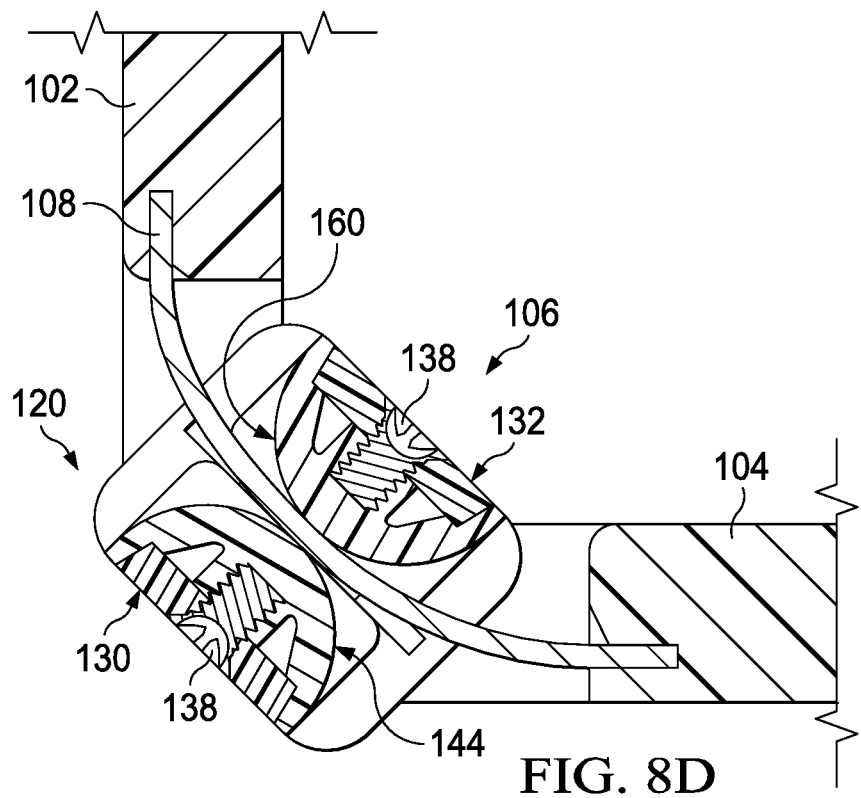

Turning to FIG. 8D, FIG. 8D is a simplified block diagram of a portion of hinge 106 when first housing 102 has been rotated (e.g., about ninety degrees (90°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8E:
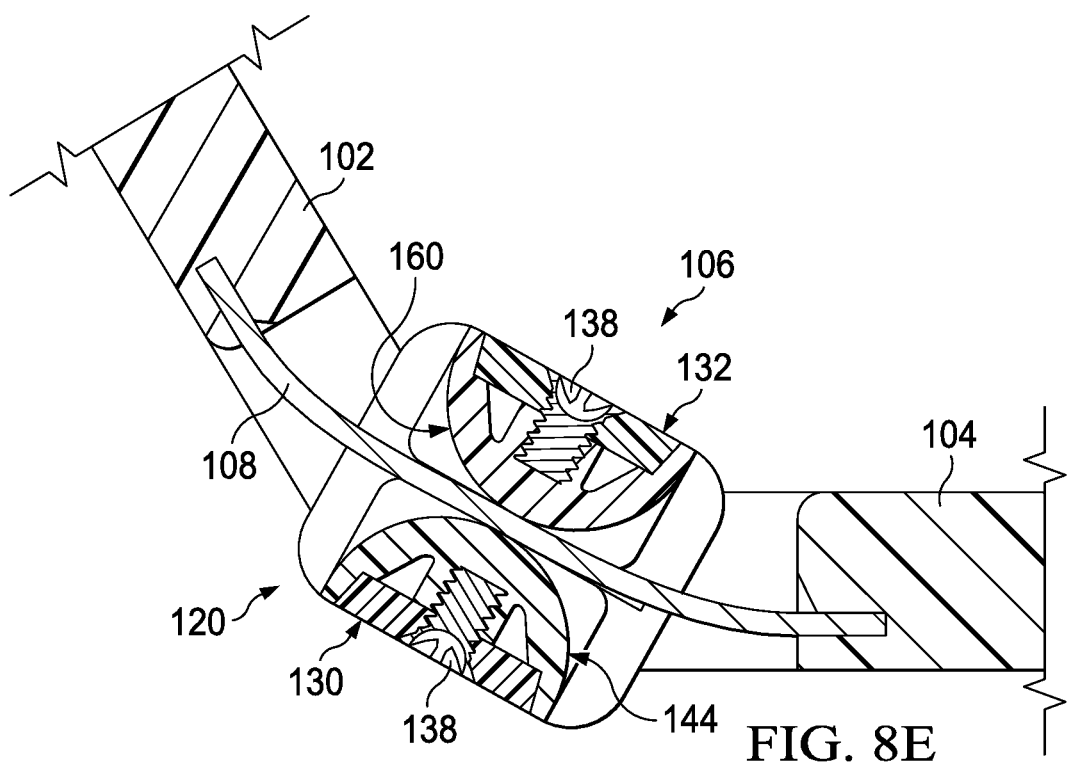

Turning to FIG. 8E, FIG. 8E is a simplified block diagram of a portion of hinge 106 when first housing 102 has been rotated (e.g., about one-hundred and twenty degrees (120°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8F:
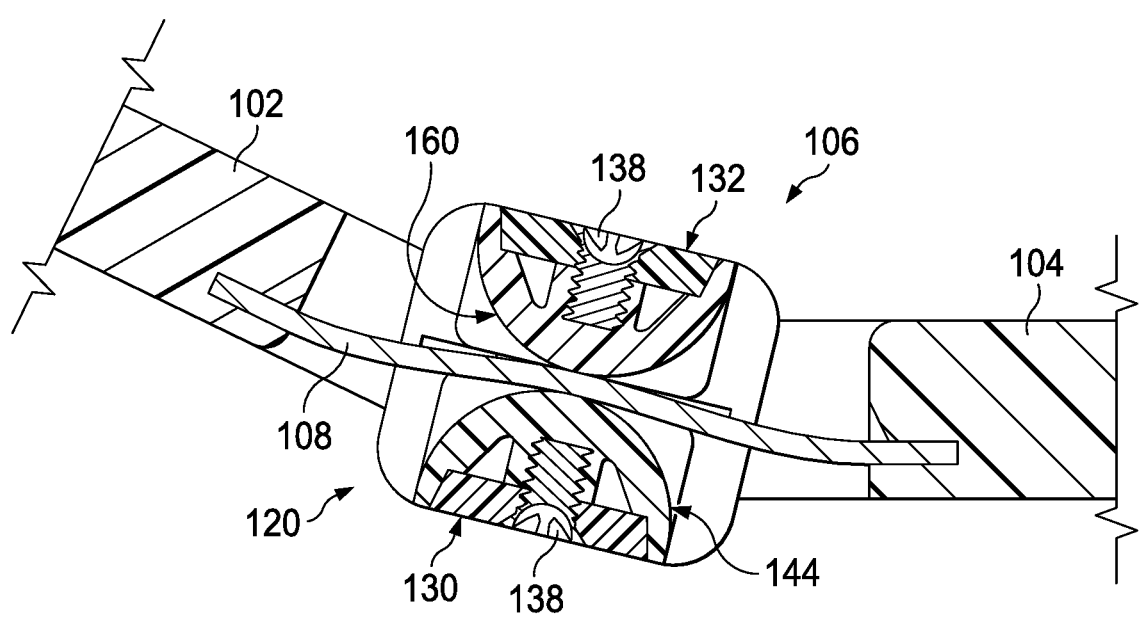

Turning to FIG. 8F, FIG. 8F is a simplified block diagram of a portion of hinge 106 when first housing 102 has been rotated (e.g., about one-hundred and fifty degrees (150°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8G:
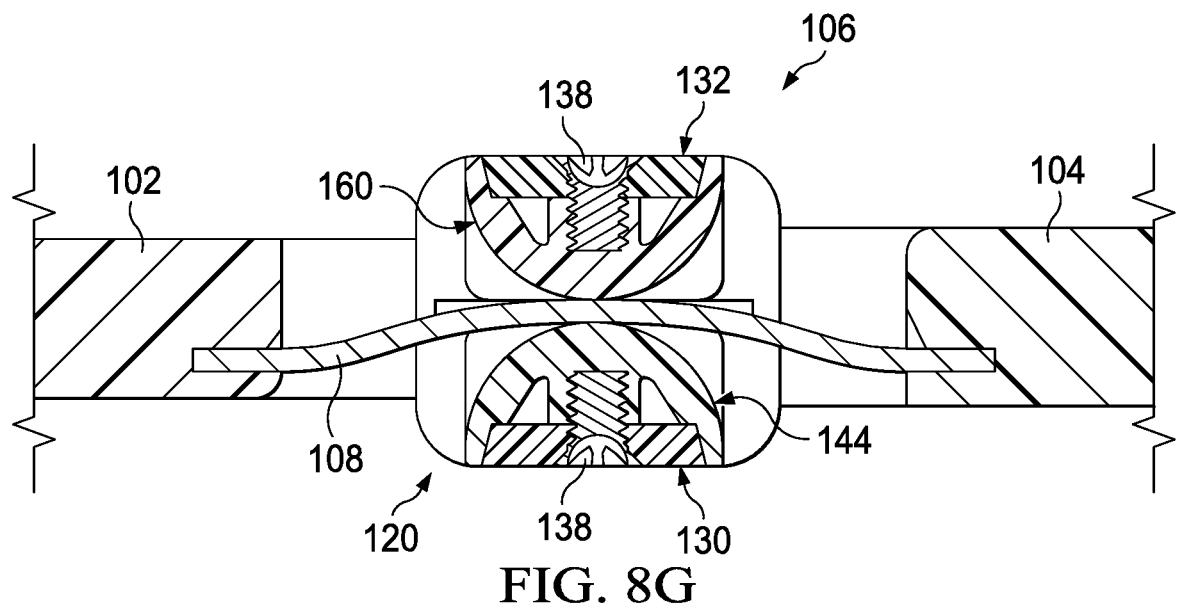

Turning to FIG. 8G, FIG. 8G is a simplified block diagram of a portion of hinge 106 when first housing 102 has been rotated (e.g., about one-hundred and eighty degrees (180°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8H:
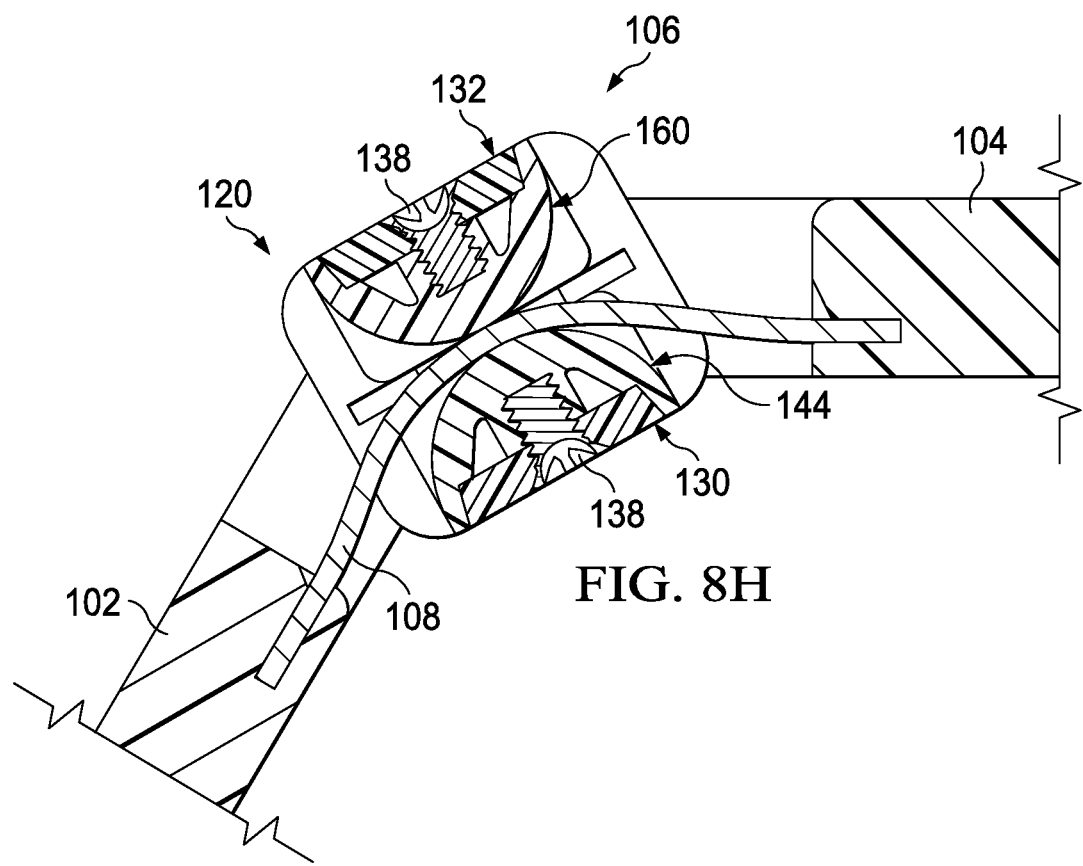

Turning to FIG. 8H, FIG. 8H is a simplified block diagram of a portion of hinge 106 when first housing 102 has been rotated (e.g., about two-hundred and ten degrees (210°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8I:
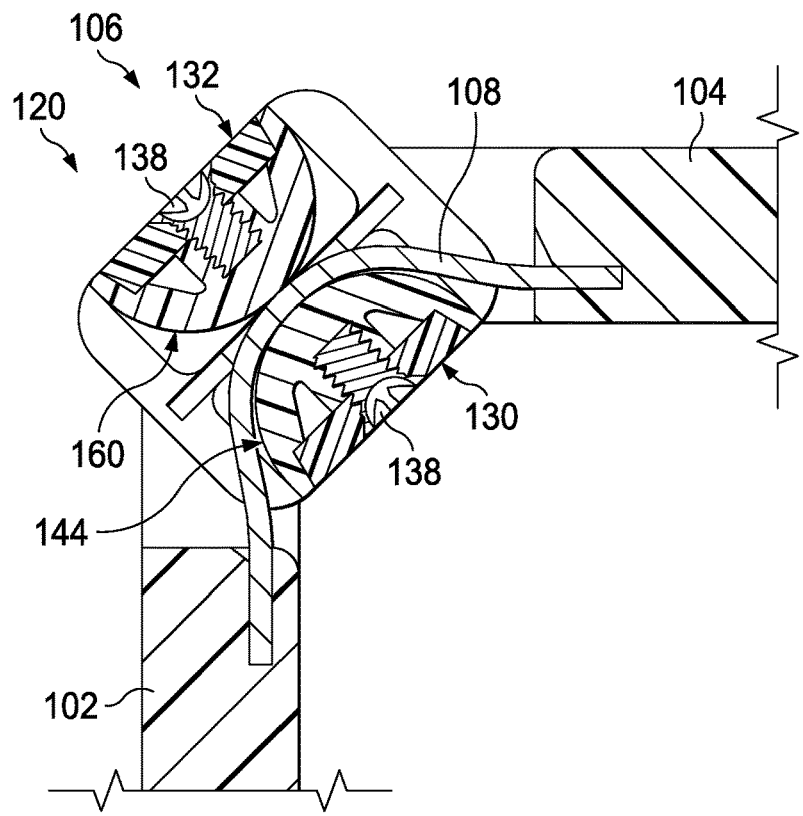

Turning to FIG. 8I, FIG. 8I is a simplified block diagram of a portion of hinge 106 when first housing 102 has been rotated (e.g., about two-hundred and seventy degrees (270°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8J:
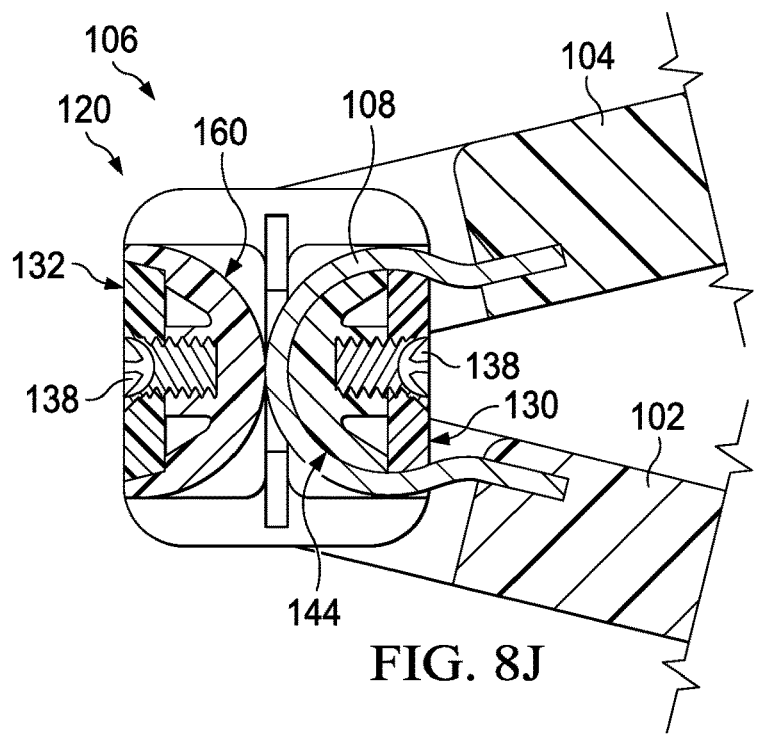

Turning to FIG. 8J, FIG. 8J is a simplified block diagram of a portion of hinge 106 when first housing 102 has been rotated (e.g., about three-hundred and thirty degrees (330°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 8K:
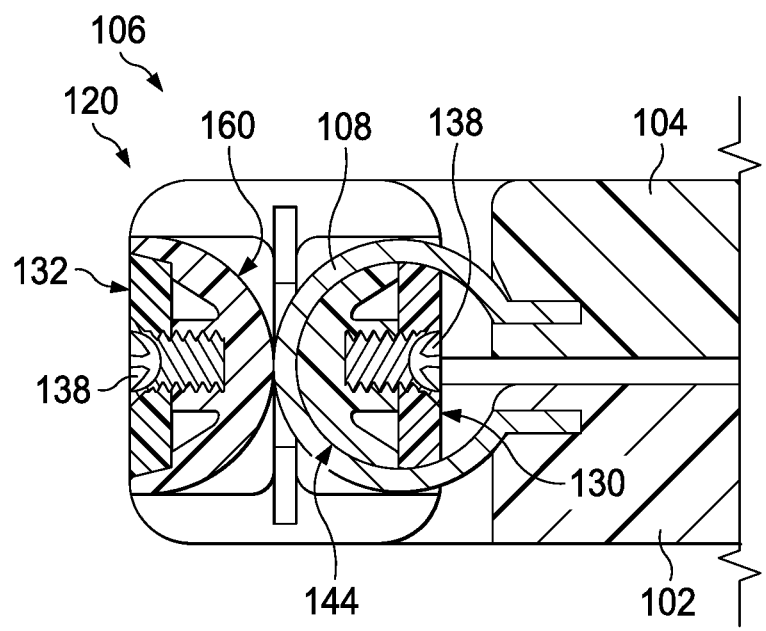

Turning to FIG. 8K, FIG. 8K is a simplified block diagram of a portion of hinge 106 when first housing 102 has been rotated (e.g., about three-hundred and sixty degrees (360°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can include securing means 138 and moving roller curved profile 144. Fixed roller 132 can include securing means 138 and fixed roller curved profile 160. Flexible heat spreader 108 can extend from second housing 104, through middle section 120 of hinge 106, and to first housing 102. More specifically, as first housing 102 is rotated relative to second housing 104, flexible heat spreader 108 can be between moving roller 130 and fixed roller 132 and follow the profile of fixed roller curved profile 160.

Figure 9A:
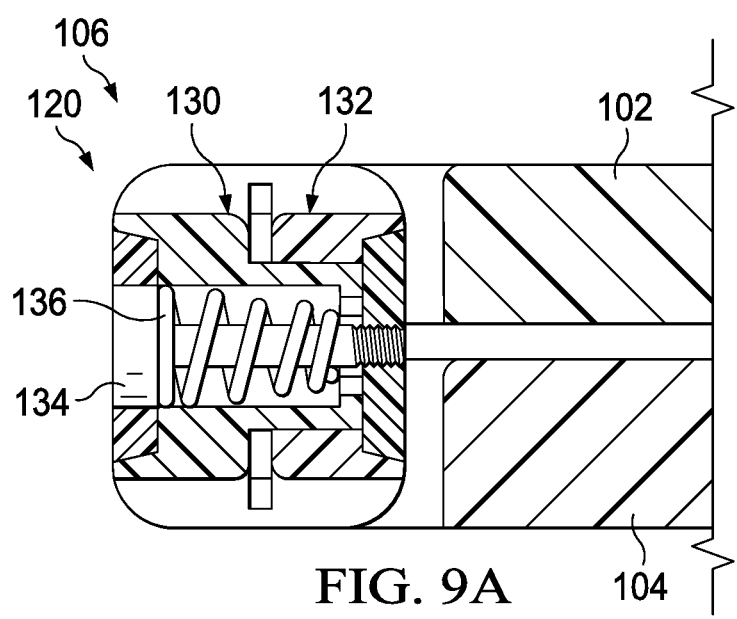
FIG. 9A is a simplified block diagram of a portion of an electronic device to enable a flexible hinge to accommodate a flexible heat spreader, in accordance with an embodiment of the present disclosure.

Turning to FIG. 9A, FIG. 9A is a simplified block diagram of a portion of hinge 106 when electronic device 100 is in a closed configuration. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can be coupled to fixed roller 132 using attachment means 134 and spring 136. As first housing 102 is rotated relative to second housing 104 (e.g., as illustrated in FIGS. 8A-8K), attachment means 134 and spring 136 can help prevent the material in flexible heat spreader 108 from creasing, folding, warping, or otherwise being damaged as first housing 102 is rotated on hinge 106 relative to second housing 104. More specifically, as first housing 102 is rotated relative to second housing 104, on the outside of the neutral axis of flexible heat spreader 108, the material of flexible heat spreader 108 is expanding while on the inside of the neutral axis the material of flexible heat spreader 108 is compressing. This causes the inside surface of flexible heat spreader 108, being inside of the bent neutral axis, to bend to a smaller radius than the outside of the bent neutral axis due to the bending arc length the inside surface of flexible heat spreader 108 being smaller than the bending arc length of the outside surface of flexible heat spreader 108. Attachment means 134 and spring 136 can accommodate the change in position of the material in flexible heat spreader 108 such that the material in flexible heat spreader 108 is not creased, folded, warped, or otherwise damaged as first housing 102 is rotated on hinge 106 relative to second housing 104.

Figure 9B:
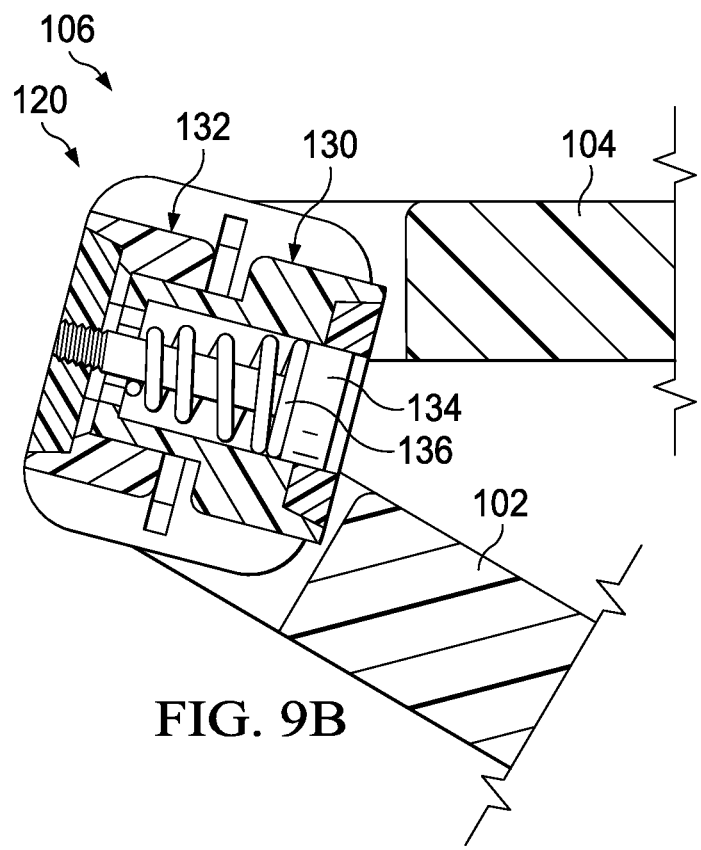
FIG. 9B is a simplified block diagram of a portion of an electronic device to enable a flexible hinge to accommodate a flexible heat spreader, in accordance with an embodiment of the present disclosure.

Turning to FIG. 9B, FIG. 9B is a simplified block diagram of a portion of hinge 106 when first housing 102 has been rotated (e.g., about three-hundred and thirty degrees (330°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can be coupled to fixed roller 132 using attachment means 134 and spring 136. As first housing 102 is rotated relative to second housing 104 (e.g., as illustrated in FIGS. 8A-8K), attachment means 134 and spring 136 can help prevent the material in flexible heat spreader 108 from creasing, folding, warping, or otherwise being damaged as first housing 102 is rotated on hinge 106 relative to second housing 104. More specifically, as first housing 102 is rotated relative to second housing 104, flexible heat spreader 108 bends and moving roller 130 will move out and stretch spring 136 to accommodate the bending arc length the inside surface of flexible heat spreader 108 being smaller than the bending arc length of the outside surface of flexible heat spreader 108.

Figure 9C:
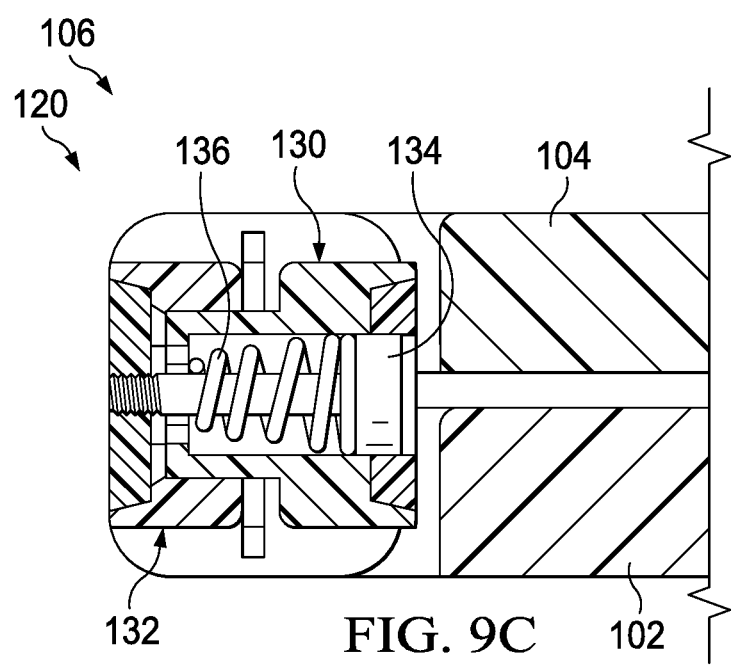
FIG. 9C is a simplified block diagram of a portion of an electronic device to enable a flexible hinge to accommodate a flexible heat spreader, in accordance with an embodiment of the present disclosure.

Turning to FIG. 9C, FIG. 9C is a simplified block diagram of a portion of hinge 106 when first housing 102 has been rotated (e.g., about three-hundred and sixty degrees (360°)) relative to second housing 104. Hinge 106 can be coupled to first housing 102 using first housing attachment 126 (illustrated in FIG. 3) and to second housing 104 using second housing attachment 128 (illustrated in FIG. 3). Hinge 106 can include middle section 120. Middle section 120 can include moving roller 130 and fixed roller 132. Moving roller 130 can be coupled to fixed roller 132 using attachment means 134 and spring 136. As first housing 102 is rotated relative to second housing 104 (e.g., as illustrated in FIGS. 8A-8K), attachment means 134 and spring 136 can help prevent the material in flexible heat spreader 108 from creasing, folding, warping, or otherwise being damaged as first housing 102 is rotated on hinge 106 relative to second housing 104. More specifically, as first housing 102 is rotated relative to second housing 104, flexible heat spreader 108 bends and moving roller 130 will move out and stretch spring 136 to accommodate the bending arc length the inside surface of flexible heat spreader 108 being smaller than the bending arc length of the outside surface of flexible heat spreader 108. When first housing 102 is rotated relative to second housing 104 and returns to the position illustrated in FIG. 9A, the tension in spring 136 returns moving roller 130 to the closed configuration position.

Figure 10:
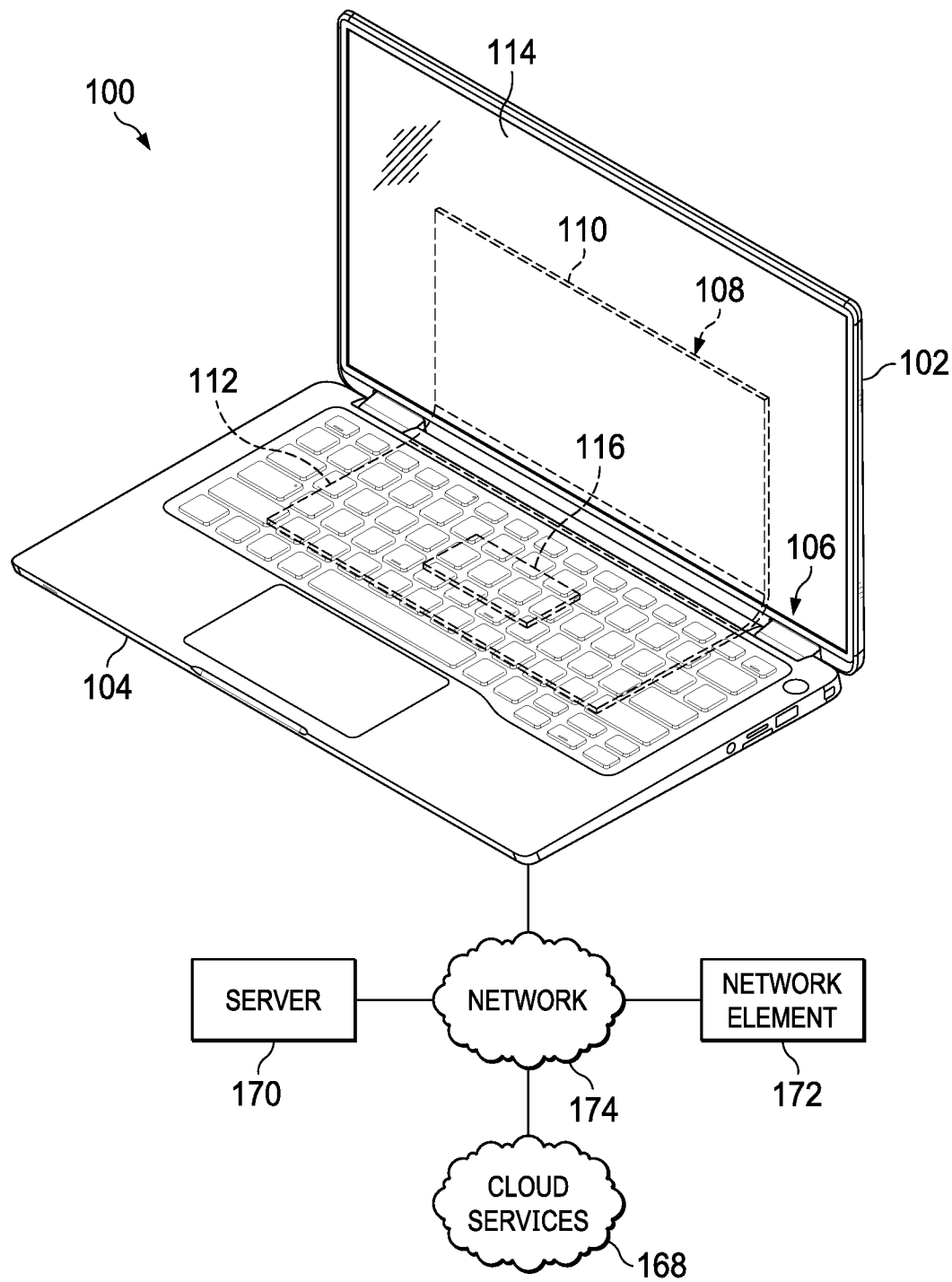
FIG. 10 is a simplified block diagram of a portion of an electronic device to enable a flexible hinge to accommodate a flexible heat spreader, in accordance with an embodiment of the present disclosure.

Turning to FIG. 10, FIG. 10 is a simplified block diagram of electronic device 100 configured with a flexible hinge to accommodate a flexible heat spreader, in accordance with an embodiment of the present disclosure. As illustrated in FIG. 10, electronic device is in an open configuration. In an example, electronic device 100 can include first housing 102 and second housing 104. First housing 102 can be rotatably coupled to second housing 104 using hinge 106. First housing 102 can include display 114. Flexible heat spreader 108 can extend from second housing 104, through hinge 106, and to first housing 102. Flexible heat spreader 108 can include first housing portion heat spreader 110 located in first housing 102 and second housing portion heat spreader 112 located in second housing 104. Second housing portion heat spreader 112 can be over heat source 116 in second housing 104. Electronic device 100 may be in communication with cloud services 168, one or more servers 170, and/or one or more network elements 172 using network 174. In some examples, electronic device 100 may be standalone devices and not connected to network 174 or another device.

Elements of FIG. 10 may be coupled to one another through one or more interfaces employing any suitable connections (wired or wireless), which provide viable pathways for network (e.g., network 174, etc.) communications. Additionally, any one or more of these elements of FIG. 10 may be combined or removed from the architecture based on particular configuration needs. Network 174 may include a configuration capable of transmission control protocol/Internet protocol (TCP/IP) communications for the transmission or reception of packets in a network. Electronic devices 100 may also operate in conjunction with a user datagram protocol/IP (UDP/IP) or any other suitable protocol where appropriate and based on particular needs.

Turning to the infrastructure of FIG. 10, network 174 represents a series of points or nodes of interconnected communication paths for receiving and transmitting packets of information. Network 174 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 174, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic device 100 has been illustrated with reference to particular elements and operations that facilitate a flexible hinge to accommodate a flexible heat spreader, these elements may be replaced by any suitable architecture and/or processes that achieve the intended functionality of electronic device 100.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

Example A1, is an electronic device including a first housing, a second housing, a hinge, wherein the hinge rotatably couples the first housing to the second housing, and a flexible heat spreader. The flexible heat spreader extends from the second housing, through the hinge, and to the first housing, wherein the hinge can accommodate deformations in the flexible heat spreader when the first housing is rotated relative to the second housing.

In Example A2, the subject matter of Example A1 can optionally include where the hinge includes a moving roller and a fixed roller.

In Example A3, the subject matter of any one of Examples A1-A2 can optionally include where the moving roller and the fixed roller each have a curved profile.

In Example A4, the subject matter of any one of Examples A1-A3 can optionally include where the moving roller and the fixed roller are coupled together to create the hinge using an attachment means and a spring.

In Example A5, the subject matter of any one of Examples A1-A4 can optionally include where the attachment means and the spring allow the moving roller to move relative to the fixed roller to accommodate the deformations in the flexible heat spreader when the first housing is rotated relative to the second housing.

In Example A6, the subject matter of any one of Examples A1-A5 can optionally include where the flexible heat spreader is a flexible graphite sheet, a flexible copper sheet, or a flexible aluminum sheet.

In Example A7, the subject matter of any one of Examples A1-A6 can optionally include where the first housing can rotate from about zero degrees to about three-hundred and sixty degrees relative to the second housing.

Example M1 is a method including rotating a first housing relative to a second housing using a hinge, wherein a flexible heat spreader extends from the second housing, through the hinge, and to the first housing, wherein the hinge can accommodate deformations in the flexible heat spreader when the first housing is rotated relative to the second housing.

In Example M2, the subject matter of Example M1 can optionally include where the hinge includes a moving roller and a fixed roller.

In Example M3, the subject matter of any one of the Examples M1-M2 can optionally include where the moving roller and the fixed roller each have a curved profile.

In Example M4, the subject matter of any one of the Examples M1-M3 can optionally include where the moving roller and the fixed roller are coupled together to create the hinge using an attachment means and a spring.

In Example M5, the subject matter of any one of the Examples M1-M4 can optionally include where the attachment means and the spring allow the moving roller to move relative to the fixed roller to accommodate the deformations in the flexible heat spreader when the first housing is rotated relative to the second housing.

In Example M6, the subject matter of any one of the Examples M1-M5 can optionally include where the flexible heat spreader is a graphite sheet, a copper sheet, or an aluminum sheet.

In Example M7, the subject matter of any one of the Examples M1-M6 can optionally include where the first housing can rotate from about zero degrees to about three-hundred and sixty degrees relative to the second housing.

Example S1 is a system for enabling flexible hinge to accommodate a flexible heat spreader. The flexible hinge can include a first housing attachment mechanism to couple the flexible hinge to a first housing, a second housing attachment mechanism to couple the flexible hinge to a second housing, wherein the hinge rotatably couples the first housing to the second housing, and a flexible heat spreader, wherein the flexible heat spreader extends from the second housing, through the flexible hinge, and to the first housing, wherein the flexible hinge can accommodate deformations in the flexible heat spreader when the first housing is rotated relative to the second housing.

In Example S2, the subject matter of Example S1 can optionally include where the flexible hinge includes a moving roller and a fixed roller.

In Example S3, the subject matter of any one of the Examples S1-S2 can optionally include where the moving roller and the fixed roller each have a curved profile.

In Example S4, the subject matter of any one of the Examples S1-S3 can optionally include where the moving roller and the fixed roller are coupled together to create the flexible hinge using an attachment means and a spring, wherein the attachment means and the spring allow the moving roller to move relative to the fixed roller to accommodate the deformations in the flexible heat spreader when the first housing is rotated relative to the second housing.

In Example S5, the subject matter of any one of the Examples S1-S4 can optionally include where the flexible heat spreader is a graphite sheet, a copper sheet, or an aluminum sheet.

In Example S6, the subject matter of any one of the Examples S1-S5 can optionally include where the first housing can rotate from about zero degrees to about three-hundred and sixty degrees relative to the second housing.

What is claimed is:
1. An electronic device comprising:
a first housing;
a second housing;
a flexible heat spreader wherein the flexible heat spreader extends from the second housing, through a hinge, and to the first housing; and
the hinge, wherein the hinge rotatably couples the first housing to the second housing and the hinge includes:
a moving roller having a semi-circular profile; and
a fixed roller having the semi-circular profile, wherein the flexible heat spreader is between a curved portion of the semi-circular profile of the moving roller and the fixed roller.
2. The electronic device of claim 1, wherein the hinge includes:

a first housing attachment that couples the hinge to the first housing; and a second housing attachment that couples the hinge to the second housing.

3. The electronic device of claim 1, wherein the moving roller and the fixed roller are coupled together to create the hinge using an attachment and a spring.

4. The electronic device of claim 3, wherein the attachment and the spring allow the moving roller to move relative to the fixed roller to accommodate deformations in the flexible heat spreader when the first housing is rotated relative to the second housing.

5. The electronic device of claim 1, wherein the flexible heat spreader is a flexible graphite sheet, a flexible copper sheet, or a flexible aluminum sheet.

6. The electronic device of claim 1, wherein the first housing can rotate from about zero degrees to one-hundred and eighty degrees relative to the second housing and from zero degrees to about three-hundred and sixty degrees relative to the second housing.

7. The electronic device of claim 1, wherein the hinge further includes:
a middle section that includes the moving roller and the fixed roller, wherein the middle section includes a first end and an opposite second end;
a first hinge cap located on the first end of the middle section;
a second hinge cap located on the second end of the middle section; and
a first torque engine coupled to the first hinge cap, wherein the first torque engine includes a first housing attachment coupled to the first housing; and
a second torque engine coupled to the second hinge cap, wherein the second torque engine includes a second housing attachment coupled to the second housing.

8. The electronic device of claim 1, wherein the fixed roller includes a fixed roller middle portion and fixed roller ends, each of the fixed roller ends include a slack roller cap housing to provide a housing or fitting for a slack roller cap on the moving roller.

9. The electronic device of claim 8, wherein when the moving roller rotates relative to the fixed roller, the slack roller cap on the moving roller moves in the slack roller cap housing on the fixed roller and helps keep the moving roller and the fixed roller in alignment relative to each other.

10. The electronic device of claim 8, wherein the slack roller cap, an attachment means, and a spring extend from the moving roller into the slack roller cap housing.

11. The electronic device of claim 1, wherein the moving roller includes a moving roller middle portion and moving roller ends, the moving roller middle portion includes securing means and each of the moving roller ends can include a slack roller cap configured to help guide an attachment and a spring as the attachment couples the moving roller to the fixed roller.

12. A method comprising:
rotating a first housing one-hundred and eighty degrees relative to a second housing using a hinge, wherein a flexible heat spreader extends from the second housing, through the hinge, and to the first housing, wherein the hinge includes a moving roller having a semi-circular profile and a fixed roller having the semi-circular profile, wherein when the first housing is rotated relative to the second housing, a slack roller cap on the moving roller moves in a slack roller cap housing on the fixed roller.

13. The method of claim 12, wherein the moving roller and the fixed roller are coupled together using an attachment and a spring that extend through the slack roller cap.

14. The method of claim 13, wherein the attachment and the spring allow the moving roller to move relative to the fixed roller to accommodate deformations in the flexible heat spreader when the first housing is rotated relative to the second housing.

15. The method of claim 12, wherein the flexible heat spreader is a graphite sheet, a copper sheet, or an aluminum sheet.

16. The method of claim 12, wherein, in addition to rotating from zero degrees to one-hundred and eighty degrees, the first housing can rotate from about zero degrees to three-hundred and sixty degrees relative to the second housing.

\* \* \* \* \*